(12) United States Patent
Bae et al.

(10) Patent No.: US 11,616,108 B2
(45) Date of Patent: Mar. 28, 2023

(54) ORGANIC LIGHT EMITTING DIODE DISPLAY

(71) Applicant: SAMSUNG DISPLAY CO., LTD., Yongin-si (KR)

(72) Inventors: Joon Woo Bae, Yongin-si (KR); Mee Jae Kang, Yongin-si (KR); Thanh Tien Nguyen, Yongin-si (KR); Kyoung Won Lee, Yongin-si (KR); Yong Su Lee, Yongin-si (KR); Jae Seob Lee, Yongin-si (KR); Gyoo Chul Jo, Yongin-si (KR); Myoung Geun Cha, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/661,329

(22) Filed: Oct. 23, 2019

(65) Prior Publication Data

US 2020/0135831 A1    Apr. 30, 2020

(30) Foreign Application Priority Data

Oct. 24, 2018 (KR) .................. 10-2018-0127466

(51) Int. Cl.
  *H01L 27/32* (2006.01)

(52) U.S. Cl.
  CPC ...... *H01L 27/3272* (2013.01); *H01L 27/3262* (2013.01); *H01L 27/3265* (2013.01); *H01L 27/3276* (2013.01)

(58) Field of Classification Search
  CPC ............. H01L 27/3262; H01L 27/3265; H01L 27/3272; H01L 27/3276; H01L 51/56; H01L 51/52; H01L 27/3213; G09G 3/3233
  See application file for complete search history.

(56) References Cited

U.S. PATENT DOCUMENTS 6,486,606 B1 * 11/2002 Ting .................. G09G 3/3225
                                                                     315/169.3
9,660,090 B2 *  5/2017 Yoon .................. H01L 27/3272
(Continued)

FOREIGN PATENT DOCUMENTS

JP         09-073102 A      3/1997
KR    10-2016-0009220 A      1/2016
(Continued)

OTHER PUBLICATIONS

Mallory Mativenga, et al., "Bulk Accumulation a-IGZO TFT for High Current and Turn-on Voltage Uniformity," IEE Electron Device Letters, vol. 34, No. 12, Dec. 2013.

*Primary Examiner* — Mary A Wilczewski
(74) *Attorney, Agent, or Firm* — Kile Park Reed & Houtteman PLLC

(57) ABSTRACT

An organic light emitting diode display includes a substrate, an overlap layer on the substrate, a semiconductor layer on the overlap layer, a first gate conductor on the semiconductor layer, a second gate conductor on the first gate conductor, a data conductor on the second gate conductor, a driving transistor on the overlap layer, and an organic light emitting diode connected with the driving transistor. The driving transistor includes, in the semiconductor layer, a first electrode, a second electrode, with a channel therebetween. A gate electrode of the first gate conductor overlaps the channel. The overlap layer overlaps the channel of the driving transistor and at least a portion of the first electrode. A storage line of the second gate conductor receives a driving voltage through a driving voltage line in the data conductor. The overlap layer receives a constant voltage.

14 Claims, 13 Drawing Sheets

(56) References Cited

U.S. PATENT DOCUMENTS

| | | | |
|---|---|---|---|
| 9,934,723 B2 | 4/2018 | Lee et al. | |
| 9,978,826 B2* | 5/2018 | Park | H01L 27/3272 |
| 10,573,703 B2* | 2/2020 | Lee | G09G 3/3266 |
| 10,985,068 B2* | 4/2021 | Lee | H01L 27/3244 |
| 11,251,251 B2* | 2/2022 | Kim, II | G09G 3/3225 |
| 11,257,886 B2* | 2/2022 | Bae | H01L 27/3276 |
| 11,502,149 B2* | 11/2022 | Lim | H01L 27/3276 |
| 2008/0079005 A1* | 4/2008 | Tseng | H01L 27/1255 345/82 |
| 2012/0249906 A1* | 10/2012 | Nakagawa | G02F 1/136213 349/38 |
| 2013/0337596 A1* | 12/2013 | Hung | H01L 27/1288 438/34 |
| 2014/0239270 A1* | 8/2014 | Ko | H01L 27/3265 257/40 |
| 2015/0243722 A1* | 8/2015 | Kwon | H01L 27/3272 257/40 |
| 2016/0071888 A1* | 3/2016 | Park | H01L 27/1262 257/43 |
| 2016/0141347 A1* | 5/2016 | Kwon | H01L 27/3265 257/40 |
| 2016/0141348 A1* | 5/2016 | Lin | H01L 27/3276 257/40 |
| 2016/0197132 A1* | 7/2016 | Cho | H01L 23/60 257/40 |
| 2016/0247452 A1* | 8/2016 | Lee | H01L 27/3272 |
| 2017/0117343 A1* | 4/2017 | Oh | H01L 27/3262 |
| 2017/0317155 A1* | 11/2017 | Oh | H01L 27/1255 |
| 2017/0330927 A1* | 11/2017 | Lee | G09G 3/3266 |
| 2018/0047799 A1* | 2/2018 | Lim | H01L 27/3248 |
| 2018/0061908 A1* | 3/2018 | Shim | G09G 3/3233 |
| 2018/0151654 A1* | 5/2018 | Lee | H01L 29/41733 |
| 2019/0043937 A1* | 2/2019 | Lee | H01L 27/3265 |
| 2019/0131369 A1* | 5/2019 | Choi | H01L 27/3276 |
| 2019/0189722 A1* | 6/2019 | Lim | H01L 27/3272 |
| 2019/0206971 A1* | 7/2019 | Kim | G09G 3/3233 |
| 2019/0206972 A1* | 7/2019 | Park | H01L 27/3262 |
| 2019/0393291 A1* | 12/2019 | Jeon | H01L 27/3272 |
| 2020/0013337 A1* | 1/2020 | Cho | G09G 3/3258 |
| 2020/0052057 A1* | 2/2020 | Kim | H01L 27/3276 |
| 2020/0083309 A1* | 3/2020 | Wang | H01L 27/1225 |
| 2020/0135831 A1* | 4/2020 | Bae | H01L 27/3272 |
| 2020/0203457 A1* | 6/2020 | Lim | H01L 51/0097 |
| 2020/0243632 A1* | 7/2020 | Lee | H01L 29/04 |
| 2020/0403059 A1* | 12/2020 | Oh | H01L 27/3265 |
| 2021/0028258 A1* | 1/2021 | Lee | H01L 27/1255 |
| 2021/0036268 A1* | 2/2021 | Cha | H01L 27/3248 |
| 2021/0104591 A1* | 4/2021 | Lim | H01L 27/3272 |
| 2021/0143242 A1* | 5/2021 | Choi | H01L 27/3272 |
| 2021/0151542 A1* | 5/2021 | Choe | H01L 27/3265 |
| 2021/0399072 A1* | 12/2021 | Song | H01L 27/3262 |
| 2022/0093713 A1* | 3/2022 | Lee | H01L 27/3276 |
| 2022/0140038 A1* | 5/2022 | Bae | H01L 27/3265 257/40 |

FOREIGN PATENT DOCUMENTS

| | | | | |
|---|---|---|---|---|
| KR | 2016039092 | * | 4/2016 | H01L 27/3255 |
| KR | 10-2018-0024314 A | | 3/2018 | |
| KR | 10-2018-0026602 A | | 3/2018 | |

* cited by examiner

ORGANIC LIGHT EMITTING DIODE DISPLAY

CROSS-REFERENCE TO RELATED APPLICATION

Korean Patent Application No. 10-2018-0127466, filed on Oct. 24, 2018, in the Korean Intellectual Property Office, and entitled: "Organic Light Emitting Diode Display," is incorporated by reference herein in its entirety.

BACKGROUND

1. Field

The present disclosure relates to an organic light emitting diode display, and more particularly to an organic light emitting diode display including an overlap layer disposed between a semiconductor layer and a substrate.

2. Description of the Related Art

An organic light emitting diode (OLED) display has a self-emission characteristic, eliminating the necessity for a light source, unlike a liquid crystal display (LCD) device, and thus can be thinner and lighter. Further, the OLED display has high quality characteristics such as low power consumption, high luminance, high response speed, and the like.

In general, the OLED display includes a substrate, a plurality of thin film transistors on the substrate, a plurality of insulating layers disposed between wires constituting thin film transistors, and light emitting elements connected to the thin film transistors. The OLED display includes a plurality of pixels, each including a plurality of transistors.

SUMMARY

An exemplary embodiment provides an organic light emitting diode display including: a substrate; an overlap layer on the substrate; a semiconductor layer on the overlap layer; a first gate conductor on the semiconductor layer; a second gate conductor on the first gate conductor; a data conductor on the second gate conductor; a driving transistor on the overlap layer; and an organic light emitting diode connected with the driving transistor. The driving transistor includes a first electrode formed in the semiconductor layer, a second electrode formed in the semiconductor layer, a channel formed between the first electrode and the second electrode, and a gate electrode formed of the first gate conductor to overlap the channel. The overlap layer overlaps the channel of the driving transistor and extends to the first electrode to overlap at least a portion of the first electrode, the second gate conductor includes a storage line to which a driving voltage is applied through a driving voltage line formed of the data conductor, and the overlap layer receives a constant voltage.

A gate insulating layer may be between the gate electrode and the storage line, and the gate electrode and the storage line may constitute a storage capacitor that maintains a voltage across the gate electrode.

A buffer layer may be between the overlap layer and the semiconductor layer, and the overlap layer and the semiconductor layer of the driving transistor may constitute an additional storage capacitor.

The overlap layer may include a base portion that overlaps the channel of the driving transistor, and the base portion and the channel of the driving transistor may constitute a first additional storage capacitor.

The overlap layer may include a first extension that overlaps the first electrode of the driving transistor, and the first extension and the first electrode of the semiconductor layer may constitute a second additional storage capacitor.

The overlap layer extends so that a left side of the overlap layer may coincide with a left side of the semiconductor layer including the first electrode of the driving transistor in a plan view.

When a distance between a left side of the gate electrode and a left side of the overlap layer is referred to as a first distance, and a distance between a right side of the gate electrode and a right side of the overlap layer is referred to as a second distance, the first distance is in a range of 1.0 μm to 4.0 μm.

When the overlap layer is formed to overlap the first electrode of the driving transistor, a reduction range of an instant afterimage may be 5 times greater than that when the overlap layer does not overlap with the first electrode of the driving transistor.

When the overlap layer is formed to overlap the first electrode of the driving transistor, the instant afterimage may be reduced by 3 seconds or more as compared with when the overlap layer does not overlap with the first electrode of the driving transistor.

A distance between overlap layers disposed at pixels adjacent to the overlap layer is in a range of 2.0 μm to 2.5 μm.

The organic light emitting diode display may further include a second transistor and a third transistor, the second transistor may be connected to a scan line and a data line transmitted through the data line to transmit a data voltage to the first electrode of the driving transistor, the third transistor may be connected to the gate electrode and the second electrode of the driving transistor to transfer the data voltage to the storage capacitor, and the overlap layer may further include a second extension overlapping the semiconductor layer of the third transistor.

The second extension of the overlap layer and the semiconductor layer of the driving transistor may constitute a third additional storage capacitor.

The overlap layer may overlap at least a portion of the second electrode of the driving transistor, and the overlap layer and the semiconductor layer may constitute a fourth additional storage capacitor.

An exemplary embodiment provides an organic light emitting diode display including: a substrate; an overlap layer on the substrate; a semiconductor layer on the overlap layer; a gate electrode on the semiconductor layer; a storage line on the gate electrode; a driving voltage line on the storage line; a driving transistor on the overlap layer; a third transistor on the overlap layer; and an organic light emitting diode connected with the driving transistor. The driving transistor includes a first electrode formed in the semiconductor layer, a second electrode formed in the semiconductor layer, a channel disposed between the first electrode and the second electrode, and the gate electrode. The third transistor is connected to the gate electrode and the second electrode of the driving transistor. The overlap layer overlaps the channel of the driving transistor and extends to a region of the first electrode to overlap at least a portion of the first electrode, and the semiconductor layer of the third transistor, a driving voltage is applied to the storage line through the driving voltage line. A constant voltage is applied to the overlap layer.

The overlap layer may include: a base portion that overlaps the channel of the driving transistor; and a first extension that overlaps the first electrode of the driving transistor, and the base portion and the channel of the driving transistor may constitute a first additional storage capacitor, while the first extension and the first electrode of the semiconductor layer may constitute a second additional storage capacitor.

A buffer layer may be between the overlap layer and the semiconductor layer, and the first extension of the overlap layer and the semiconductor layer of the driving transistor may constitute a third additional storage capacitor.

The organic light emitting diode display may further include a second transistor, the second transistor may be connected to the first electrode of the driving transistor, and the overlap layer may extend so that a left side of the overlap layer coincides with a left side of the semiconductor layer including the second transistor and the first electrode of the driving transistor.

When a distance between a left side of the gate electrode and a left side of the overlap layer is referred to as a first distance, and a distance between a right side of the gate electrode and a right side of the overlap layer is referred to as a second distance, the first distance is in a range of 1.0 μm to 4.0 μm.

A distance between overlap layers disposed at pixels adjacent to the overlap layer is in a range of 2.0 μm to 2.5 μm.

When the overlap layer is formed to overlap the first electrode of the driving transistor, a reduction range of an instant afterimage may be 5 times greater than that when the overlap layer does not overlap with the first electrode of the driving transistor.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
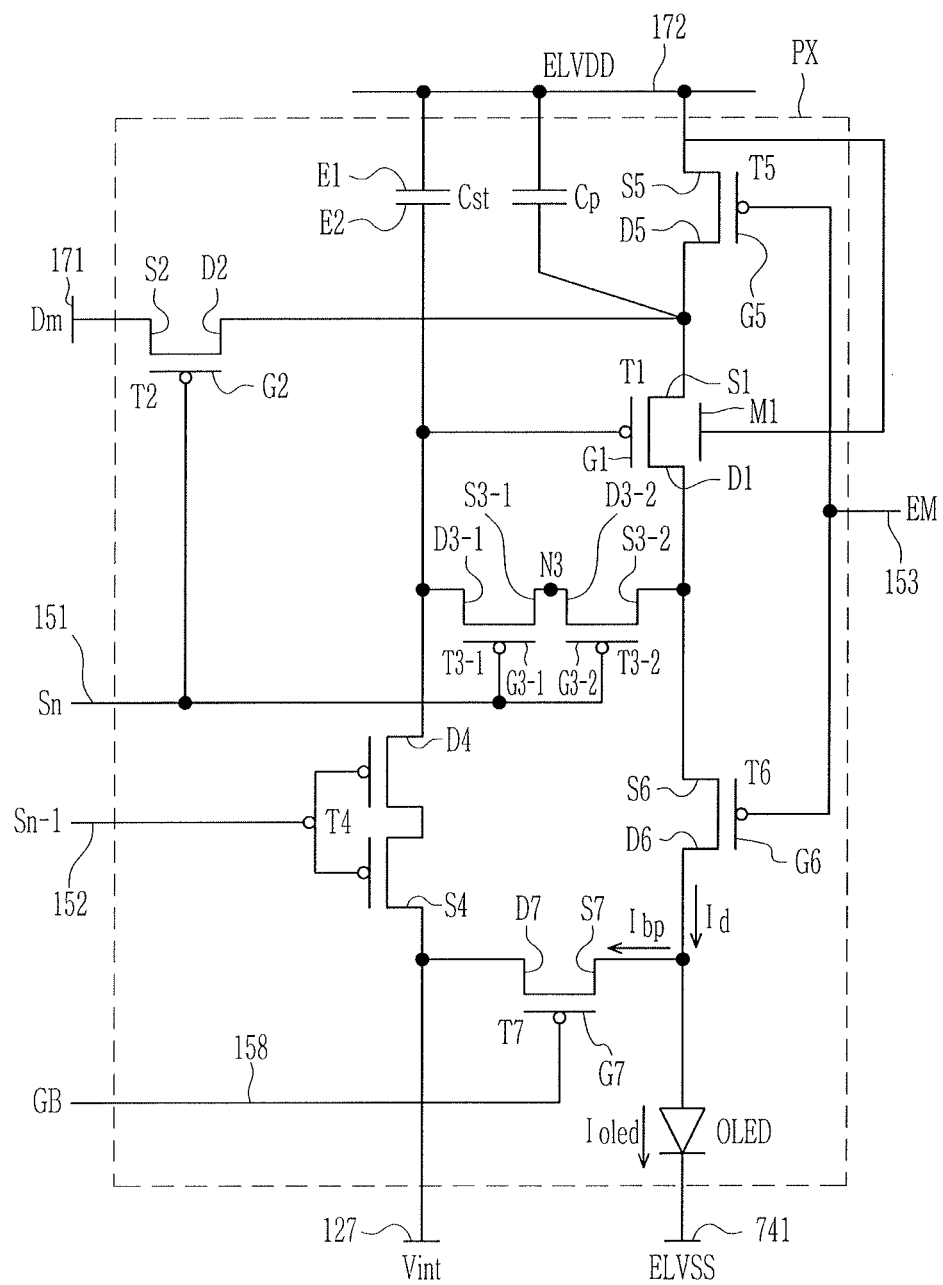
FIG. 1 illustrates an equivalent circuit diagram of one pixel of an organic light emitting diode display according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

Embodiments will be described more fully hereinafter with reference to the accompanying drawings, in which exemplary embodiments are shown. As those skilled in the art would realize, the described embodiments may be modified in various different ways, all without departing from the spirit or scope of the present disclosure.

To clearly describe embodiments, parts that are irrelevant to the description are omitted, and like numerals refer to like or similar constituent elements throughout the specification.

Further, since sizes and thicknesses of constituent members shown in the accompanying drawings are arbitrarily given for better understanding and ease of description, embodiments are not limited to the illustrated sizes and thicknesses. In the drawings, the thicknesses of layers, films, panels, regions, etc., are exaggerated for clarity. In the drawings, for better understanding and ease of description, the thicknesses of some layers and areas are exaggerated.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, the word "over" or "on" means positioning on or below the object portion and does not necessarily mean positioning on the upper side of the object portion based on a gravity direction.

In addition, unless explicitly described to the contrary, the word "comprise" and variations such as "comprises" or "comprising" will be understood to imply the inclusion of stated elements but not the exclusion of any other elements.

Further, in the specification, the phrase "in a plan view" means when an object portion is viewed from above, and the phrase "in a cross-sectional view" means when a cross-section taken by vertically cutting an object portion is viewed from the side.

Throughout the specification, a plan view represents a view for observing a side that is parallel to two directions (e.g., a first direction (DR1) and a second direction (DR2)) crossing each other, and a cross-sectional view represents a view for observing a side that is cut in a direction (e.g., a third direction (DR3)) that is perpendicular to a side that is parallel to the first direction (DR1) and the second direction (DR2). Further, when two constituent elements overlap each other, it means that the two constituent elements overlap each other in the third direction (DR3), for example, in the direction that is perpendicular to an upper side of a substrate.

Figure 2:
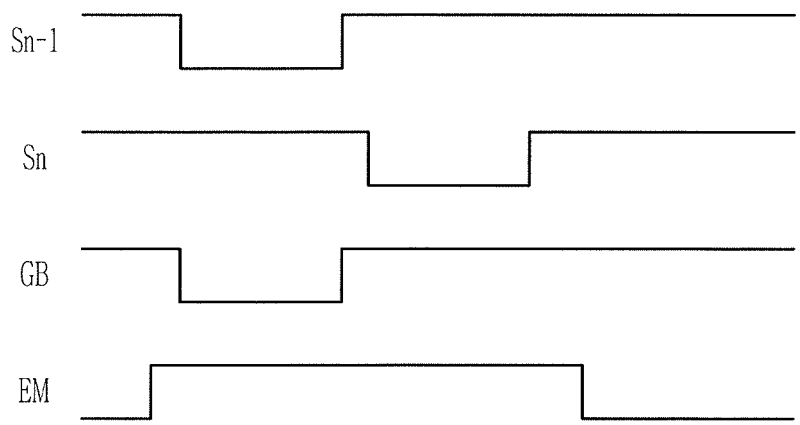
FIG. 2 illustrates a timing diagram of signals applied to one pixel of an organic light emitting diode display according to an exemplary embodiment.

Hereinafter, an organic light emitting diode display according to an exemplary embodiment will be described with reference to FIG. 1 and FIG. 2. FIG. 1 illustrates an equivalent circuit diagram of one pixel of an organic light emitting diode display according to an exemplary embodiment, and FIG. 2 illustrates a timing diagram of signals applied to one pixel of an organic light emitting diode display according to an exemplary embodiment.

Referring to FIG. 1, one pixel PX of the organic light emitting diode display includes a plurality of signal lines 127, 151, 152, 153, 158, 171, 172, and 741, a plurality of transistors T1, T2, T3, T4, T5, T6, and T7 connected thereto, a storage capacitor Cst, and an organic light emitting diode OLED.

The transistors T1, T2, T3, T4, T5, T6, and T7 include a driving transistor T1, switching transistors, i.e., a second transistor T2 and a third transistor T3, connected with a scan line 151, and other transistors (hereinafter referred to as 'compensation transistors') for performing an operation required to operate the organic light emitting diode OLED. These compensation transistors T4, T5, T6, and T7 may include a fourth transistor T4, a fifth transistor T5, a sixth transistor T6, and a seventh transistor T7.

The plurality of signal lines 127, 151, 152, 153, 158, 171, 172, and 741 may include the scan line 151, a previous-stage scan line 152, a light emission control line 153, a bypass control line 158, a data line 171, a driving voltage line 172, an initialization voltage line 127, and a common voltage line 741. The bypass control line 158 may be a portion of the previous-stage scan line 152 or may be electrically connected to the previous-stage scan line 152.

The scan line 151 is connected to a gate driver to transfer a scan signal Sn to the switching transistors, that is, the second transistor T2 and the third transistor T3. The previous-stage scan line 152 is connected to the gate driver and transfers a previous-stage scan signal S(n−1) applied to the pixel PX at a previous stage to the fourth transistor T4. Since the fourth transistor T4 includes two transistors connected in series, the previous-stage scan signal S(n−1) is applied to all gate electrodes of the two transistors connected in series included in the fourth transistor T4. The light emission control line 153 is connected to an emission controller and transfers a light emission control signal EM for controlling a light emission time of the organic light emitting diode to the fifth transistor T5 and the sixth transistor T6. The bypass control line 158 may transfer a bypass signal GB to the seventh transistor T7 and may transfer a same signal as a previous-stage scan signal S(n−1) according to an implementation.

The data line 171 supplies a data voltage Dm generated by a data driver and luminance of light output by the organic light emitting diode OLED (also referred to as an organic light emitting element) varies depending on the data voltage Dm. The driving voltage line 172 applies a driving voltage ELVDD, the initialization voltage line 127 transfers an initialization voltage Vint for initializing the driving transistor T1, and the common voltage line 741 applies a common voltage ELVSS. Constant voltages are respectively applied to the driving voltage line 172, the initialization voltage line 127, and the common voltage line 741.

The driving transistor T1 adjusts the magnitude of a current that is output depending on the data voltage Dm applied thereto, and a driving current Id output therefrom is applied to the organic light emitting diode OLED so that the brightness of the organic light emitting diode OLED is adjusted depending on the data voltage Dm. For this purpose, the first electrode S1 of the driving transistor T1 receives the driving voltage ELVDD and is connected to the driving voltage line 172 through the fifth transistor T5. The first electrode S1 of the driving transistor T1 is also connected to a second electrode D2 of the second transistor T2, so that the data voltage Dm is also applied thereto. The second electrode (output side electrode) D1 outputs a current toward the organic light emitting electrode OLED and is connected to an anode of the organic light emitting diode through the sixth transistor T6. A gate electrode G1 is connected with an electrode (a second storage electrode E2) of the storage capacitor Cst. Accordingly, a voltage of the gate electrode G1 varies depending on a voltage stored in the storage capacitor Cst. Thus, the driving current Id output by the driving transistor T1 varies.

The second transistor T2 receives the data voltage (Dm). The second transistor T2 has a gate electrode G2 connected to the first scan line 151, a first electrode S2 connected to the data line 171, and the second electrode D2 connected to the first electrode S1 of the driving transistor T1. When the second transistor T2 is turned on depending on the scan signal Sn transferred through the scan line 151, the data voltage Dm is supplied to the first electrode S1 of the driving transistor T1.

Each of the third transistor T3 and the fourth transistor T4 is illustrated as a structure including two transistors connected in series with each other. Herein, this series-connected structure indicates a structure in which gate electrodes of two transistors T3-1 and T3-2 are connected to receive a same signal, and an output of a first transistor is applied to an input of a second transistor.

The third transistor T3 includes a third-first transistor T3-1 and a third-second transistor T3-2 are connected in series. A gate electrode G3-1 of the third-first transistor T3-1 and a gate electrode G3-2 of the third-second transistor T3-2 are connected to each other.

The third transistor T3 outputs a compensation voltage Dm+Vth, obtained while the data voltage Dm is changed through the driving transistor T1, to the second storage electrode E2 of the storage capacitor Cst. The gate electrodes G3-1 and G3-2 of the transistors T3-1 and T3-2 are connected with the scan line 151. A first electrode of the third-second transistor T3-2 is connected with the second electrode D1 of the driving transistor T1, and a second electrode D3-1 of the third-first transistor T3-1 is connected with the second storage electrode E2 of the storage capacitor Cst and the gate electrode G1 of the driving transistor T1. In addition, the first electrode S3-1 of the third-first transistor T3-1 and the second electrode D3-2 of the third-second transistor T3-2 are connected with each other at a third node N3. When the third transistor T3 is described as one transistor, the first electrode S3-2 of the third-second transistor T3-2 becomes the first electrode of the third transistor T3, and the second electrode D3-1 of the third-first transistor T3-1 becomes the second electrode of the third transistor T3. The third transistor T3 is turned on depending on the scan signal Sn transferred through the scan line 151 to connect the gate electrode G1 and the second electrode D1 of the driving transistor T1, and to connect the second electrode D1 of the driving transistor T1 with the second storage electrode E2 of the storage capacitor Cst.

The fourth transistor T4 serves to initialize the gate electrode G1 of the driving transistor T1 and the second storage electrode E2 of the storage capacitor Cst. The fourth transistor T4 has a gate electrode G4 connected to the previous-stage scan line 152, a first electrode S4 connected to the initialization voltage line 127, and a second electrode D4 connected to the second storage electrode E2 of the storage capacitor Cst and the gate electrode G1 of the driving transistor T1 via the second electrode D3 of the third transistor T3. The fourth transistor T4 also includes two transistors connected in series. The fourth transistor T4 transfers the initialization voltage Vint to the gate electrode G1 of the driving transistor T1 and the second storage electrode E2 of the storage capacitor Cst depending on the previous-stage scan signal S(n−1) transferred through the previous-stage scan line 152. Thus, the gate voltage of the gate electrode G1 of the driving transistor T1 and the storage capacitor Cst are initialized. The initialization voltage Vint may be a voltage that has a low voltage value to turn on the driving transistor T1. The fourth transistor T4 may also include two transistors connected in series or may be a single transistor according to another implementation.

The fifth transistor T5 transfers the driving voltage ELVDD to the driving transistor T1. The fifth transistor T5 has a gate electrode G5 connected to the light emission control line 153, the first electrode S5 connected to the driving voltage line 172 and a second electrode D5 connected to the first electrode S1 of the driving transistor T1.

The sixth transistor T6 transfers the driving current Id output from the driving transistor T1 to the organic light emitting diode OLED. The sixth transistor T6 has a gate electrode G6 connected to the light emission control line 153, a first electrode S6 is connected to the second electrode D1 of the driving transistor T1, and a second electrode D6 connected to the anode of the light emitting diode OLED.

The fifth transistor T5 and the sixth transistor T6 are simultaneously turned on depending on the light emission control signal EM transferred through the light emission control line 153. When the driving voltage ELVDD is applied to the first electrode S1 of the driving transistor T1 through the fifth transistor T5, the driving transistor T1 outputs the driving current Id depending on the voltage of the gate electrode G1 of the driving transistor T1 (i.e., the voltage of the second storage electrode E2 of the storage capacitor Cst). The output driving current Id is transferred to the organic light emitting diode OLED through the sixth transistor T6. The organic light emitting diode OLED emits light as a current Ioled flows through the organic light emitting diode OLED.

The seventh transistor T7 initializing the anode of the organic light emitting diode OLED. The seventh transistor T7 has a gate electrode G7 connected to the bypass control line 158, a first electrode S7 connected to the anode of the organic light emitting diode OLED, and a second electrode D7 connected to the initialization voltage line 127. The bypass control line 158 may be connected to the previous-stage scan line 152, and a signal having a same timing as the previous-stage scan signal S(n−1) may be applied as the bypass signal GB. The bypass control line 158 may not be connected to the previous-stage scan line 152 and may transfer a separate signal from the previous-stage scan signal S(n−1). When the seventh transistor T7 turns on in accordance with the bypass signal GB, the initialization voltage Vint is applied to the anode of the organic light emitting diode OLED and initialized.

A first storage electrode E1 of the storage capacitor Cst is connected to the driving voltage line 172. The second storage electrode E2 is connected to the gate electrode G1 of the driving transistor T1, the second electrode D3 of the third transistor T3, and the second electrode D4 of the fourth transistor T4. As a result, the second storage electrode E2 determines the voltage of the gate electrode G1 of the driving transistor T1 and receives the data voltage Dm through the second electrode D3 of the third transistor T3 or the initialization voltage Vint through the second electrode D4 of the fourth transistor T4.

In the exemplary embodiment of FIG. 1, the pixel circuit includes seven transistors T1 to T7 and one capacitor Cst. Numbers of the transistors and the capacitors and connections therebetween may be variously modified. The organic light emitting diode display includes a display area for displaying an image in which such pixels PX are arranged in various ways, e.g., a matrix.

According to the exemplary embodiment of FIG. 1, the organic light emitting diode display further includes an overlap layer M1 between a semiconductor layer and a substrate. The overlap layer M1 overlaps the driving transistor T1, which supplies a current to the organic light emitting diode OLED in a plan view, e.g., along the third direction DR3.

The overlap layer M1 is below a semiconductor layer of the driving transistor T1 to overlap the same. Specifically, the overlap layer M1 is opposite to a gate electrode G1 of the driving transistor T1 with respect to the semiconductor layer 130 on which a channel of the driving transistor T1 is formed. The overlap layer M1 may also serve as a second gate electrode of the driving transistor T1 and may be referred to as a second gate electrode.

Herein, in addition to the storage capacitor Cst, an additional storage capacitor Cp is formed by the semiconductor layer of the driving transistor T1 and the overlap layer M1. The additional storage capacitor Cp has a first end connected to the driving voltage line 172 and a second end connected to the first electrode S1 of the driving transistor T1. The additional storage capacitors Cp include a first additional storage capacitor Cm and a second additional storage capacitor Cse. The first additional storage capacitor Cm is formed by the channel of the driving transistor T1 and the overlap layer M1. The second additional storage capacitor Cse is formed by a first extension of the overlap layer M1 that overlaps the first electrode S1 of the driving transistor T1. This will be described in detail below.

As such, the additional storage capacitor Cp is further formed in addition to the storage capacitor Cst. Accordingly, a total capacitance increases as compared with a case that the overlap layer M1 is not present or only overlaps a channel region of a specific transistor. The storage capacitor Cst maintains a voltage applied to the gate electrode G1 of the driving transistor T1, and the additional storage capacitor Cp maintains a voltage applied to the semiconductor layer 130 of the driving transistor T1.

The overlap layer M1 may generate an additional capacitance between the first electrode S1 and the overlap layer M1 as well as in the channel region of the semiconductor layer of the driving transistor T1 to increase the capacitance.

The overlap layer M1 may extend only to a certain extent over the first electrode S1 of the driving transistor T1. This is because, if the overlap layer M1 extends to a region beyond a pixel adjacent thereto, an area of the overlap layer for determining the capacitance may be maximized, but an afterimage characteristic may be worse due to occurrence of a short-circuit etc., caused by the overlap layer M1 extending in the adjacent pixel or residue remaining in a patterning process of the overlap layer M1.

Accordingly, the total capacitance (Cst+Cm+Cse) of the driving transistor may be optimized by extending the overlap layer M1 by a predetermined width along the first direction DR1 to overlap the first electrode S1 of the driving transistor T1, thereby maximizing an additional capacitance while ameliorating an afterimage.

The overlap layer M1 may receive a constant voltage, e.g., a driving voltage ELVDD. Along with the effect of ameliorating the above-mentioned afterimage characteristic, when the driving voltage ELVDD is uniformly applied to the overlap layer M1, a potential of the overlap layer M1 may be constantly maintained to prevent an effect thereof on surrounding electrodes. In addition, the overlap layer M1 has a light-blocking function for the driving transistor T1 overlapping the overlap layer M1 for light incident on the overlap layer M1 from the substrate, thereby preventing a leakage current and characteristic deterioration of the driving transistor T1.

The overlap layer M1 overlaps the driving transistor T1, which supplies a current to the organic light emitting diode OLED. The overlap layer M1 is below the semiconductor layer of the driving transistor T1 to overlap the same. Specifically, the overlap layer M1 is opposite to a gate electrode G1 of the driving transistor T1 with respect to the semiconductor layer on which a channel of the driving transistor T1 is formed. As described above, the overlap layer M1 may also serve as a second gate electrode of the driving transistor T1.

A relational expression between the capacitance of the additional storage capacitor Cm and Vgs is obtained by the following Equation 1.

$$V_{gs} = \frac{C_p}{C_{st}+C_p} \times \Delta V_g + V_{th\_T1} = V_1 + V_{th\_T1} \quad [\text{Equation 1}]$$

In Equation 1, Vgs indicates a voltage across the gate electrode G1 and the first electrode S1 of the driving transistor T1, which is a difference between the respective voltages. For convenience of description, in Equation 1, the capacitance of the storage capacitor Cst is denoted by Cst, and the capacitance of the additional storage capacitor Cp is denoted by Cp. $\Delta V_g$ indicates a variation range of the voltage applied to the gate.

In Equation 1, $V_1$ indicates a value obtained by multiplying the variation width $\Delta V_g$ of the voltage Vg by a ratio of Cst and Cp, and $V_{th\_T1}$ indicates a threshold voltage of the driving transistor T1. According to Equation 1, Vgs has a value obtained by adding $V_{th\_T1}$ that is affected by a ratio of Cst and Cp. That is, the voltage across the gate electrode G1 and the first electrode S1 of the driving transistor T1 is determined by the ratio of Cst and Cp.

The additional storage capacitor Cp includes the first additional storage capacitor Cm and the second additional storage capacitor Cse. Thus, a value of Cp indicates a value obtained by adding Cm and Cse.

Herein, as described above, the second additional storage capacitor Cse is formed in addition to the first additional storage capacitor Cm by extending the overlap layer M1 to overlap the first electrode S1, thereby increasing the value of Cp. Accordingly, a value of Vgs also increases according to Equation 1. As the value of Vgs becomes larger, hysteresis and afterimages decrease.

Hysteresis is a phenomenon in which a certain physical quantity is not determined solely by physical conditions at a specific point in time, but is dependent on a change process of a state in which the certain physical quantity has occurred before. In other words, as hysteresis decreases, the easier it is for the current control to improve hysteresis, decreasing an afterimage.

Specifically, in the organic light emitting diode display according to the present exemplary embodiment, the second additional storage capacitor Cse is formed by the extended overlap layer M1 to increase Cp so that Vgs may be increased according to Equation 1 to reduce the hysteresis value, thereby reducing afterimages.

Although the overlap layer M1 has been described as receiving the driving voltage ELVDD in the exemplary embodiment of FIG. 1, the overlap layer M1 may receive a voltage other than the driving voltage ELVDD. In addition, in the present exemplary embodiment, the overlap layer M1 overlaps the semiconductor layer of the driving transistor T1, but may overlap at least one semiconductor layer of the transistors T2, T3, T4, T5, T6, and T7 other than the driving transistor T1.

Operation of the circuit diagram of FIG. 1 is shown in FIG. 2. As shown in FIG. 2, the previous-stage scan signal S(n−1) of a low level is supplied to the pixels PX through the previous-stage scan line 152 during an initialization period. Then, the applied fourth transistor T4 is turned on to apply an initialization voltage Vint to the gate electrode G1 of the driving transistor T1 and the second storage electrode E2 of the storage capacitor Cst through the fourth transistor T4. As a result, the driving transistor T1 and the storage capacitor Cst are initialized. The initialization voltage Vint has a low value to turn on the driving transistor T1.

During the initialization period, a low level bypass signal GB is also applied to the seventh transistor T7. The seventh transistor T7 is turned on to apply the initialization voltage Vint to the anode of the organic light emitting diode OLED through the seventh transistor T7. As a result, the anode of the organic light emitting diode OLED is also initialized.

Then, the scan signal Sn of a low level is applied to the pixels PX through the scan line 151 during a data writing period. The second transistor T2 and the third transistor T3 are turned on by the scan signal Sn of a low level.

When the second transistor T2 is turned on, the data voltage Dm is input into the first electrode S1 of the driving transistor T1 through the second transistor T2.

In addition, the third transistor T3 is turned on during the data writing period. As a result, the second electrode D2 of the driving transistor T1 is electrically connected to the gate electrode G1 and the second storage electrode E2 of the storage capacitor Cst. The gate electrode G1 and the second electrode D2 of the driving transistor T1 are diode-connected. In addition, the driving transistor T1 is turned on because a low voltage (e.g., the initialization voltage Vint) is applied to the gate electrode G1 during the initialization period. As a result, the data voltage Dm input to the first electrode S1 of the driving transistor T1 is output from the second electrode D1 through the channel of the driving transistor T1, and then is stored in the second storage electrode E2 of the storage capacitor Cst through third transistor T3.

In this case, the voltage applied to the second storage electrode E2 may be varied depending on a threshold voltage Vth of the driving transistor T1. When the data voltage Dm is applied to the first electrode S1 of the driving transistor T1 and the initialization voltage Vint is applied to the gate electrode G1 of the driving transistor T1, the voltage output into the second electrode D1 may have a value of Vgs+Vth. As described above, Vgs indicates a difference between voltages applied to the gate electrode G1 and the first electrode S1 of the driving transistor T1, and may have a value of Dm−Vint. Therefore, the voltage that is output from the second electrode D1 and is stored in the second storage electrode E2 may have a value of Dm−Vint+Vth.

Thereafter, during an emission period, the light emission control signal EM supplied from the light emission control line 153 has a value of a low level, and the fifth transistor T5 and the sixth transistor T6 are turned on. As a result, the driving voltage ELVDD is applied to the first electrode S1 of the driving transistor T1, and the second electrode D1 of the driving transistor T1 is connected to the organic light emitting diode OLED. The driving transistor T1 generates the driving current Id according to the voltage difference between the voltage of the gate electrode G1 and the voltage of the first electrode S1 (i.e., the driving voltage ELVDD). The driving current Id of the driving transistor T1 may have a value that is proportional to a square of Vgs−Vth. Herein, the value of Vgs is equal to a difference of the voltage across opposite ends of the storage capacitor Cst, and Vgs has a value of Vg−Vs, and thus it has a value of Dm−Vint+Vth−ELVDD. Herein, the value of Vgs−Vth is obtained by subtracting the value of Vth, so it has a value of Dm−Vint−ELVDD. That is, the driving current Id of the driving transistor T1 has a current irrespective of the threshold voltage Vth of the driving transistor T1 as an output.

Accordingly, even when the driving transistor T1 in each pixel PX has different threshold voltages Vth due to process dispersion, an output current of the driving transistor T1 may be made constant, thereby ameliorating non-uniformity.

In the above equation, the value of Vth may be slightly larger than 0 or a negative value in the case of a P-type transistor using a polycrystalline semiconductor. Further, the expressions of "+" and "−" may be changed depending on a direction in which the voltage is calculated. However, there is no difference in that the driving current Id, which is the output current of the driving transistor T1, may have a value independent of the threshold voltage Vth.

When the above-mentioned emitting period ends, the initialization period starts again, and the same operation is repeated from the beginning.

The first electrode and the second electrode of the transistors T1, T2, T3, T4, T5, T6, and T7 may be a source electrode or a drain electrode depending on the direction in which a voltage or a current is applied.

In some implementations, during the initialization period, the seventh transistor T7 may not only initialize the anode of the organic light emitting diode OLED, but may also prevent a small amount of current emitted under the condition that the driving transistor T1 is not actually turned on, from flowing toward the organic light emitting diode OLED. In this case, the small amount of current is discharged through the seventh transistor T7 to a stage of the initialization voltage Vint as the bypass current Ibp. As a result, the organic light emitting diode OLED may not emit unnecessary light, thereby forming the black gray more clearly and improving the contrast ratio. In this case, the bypass signal GB may be a signal having different timing from that of the previous-stage scan signal S(n−1). According to another implementation, the seventh transistor T7 may be omitted.

In the pixel PX operating as described above, the overlap layer M1 may receive the driving voltage (ELVDD). The overlap layer M1 is between the semiconductor layer and a channel of the driving transistor T1 to form the additional storage capacitor Cp. The additional storage capacitor Cp includes the first additional storage capacitor Cm and the second additional storage capacitor Cse. In particular, the overlap layer M1 overlaps a channel of the driving transistor T1 to form the first additional storage capacitor Cm and overlaps the first electrode S1 of the driving transistor T1 to form the second additional capacitor Cse. Thus, the total capacitance Cst+Cp of the pixel PX is increased. With the second additional storage capacitor Cse is formed, Cp increases, Vgs increases by Equation 1, and hysteresis and afterimages decrease.

Figure 3:
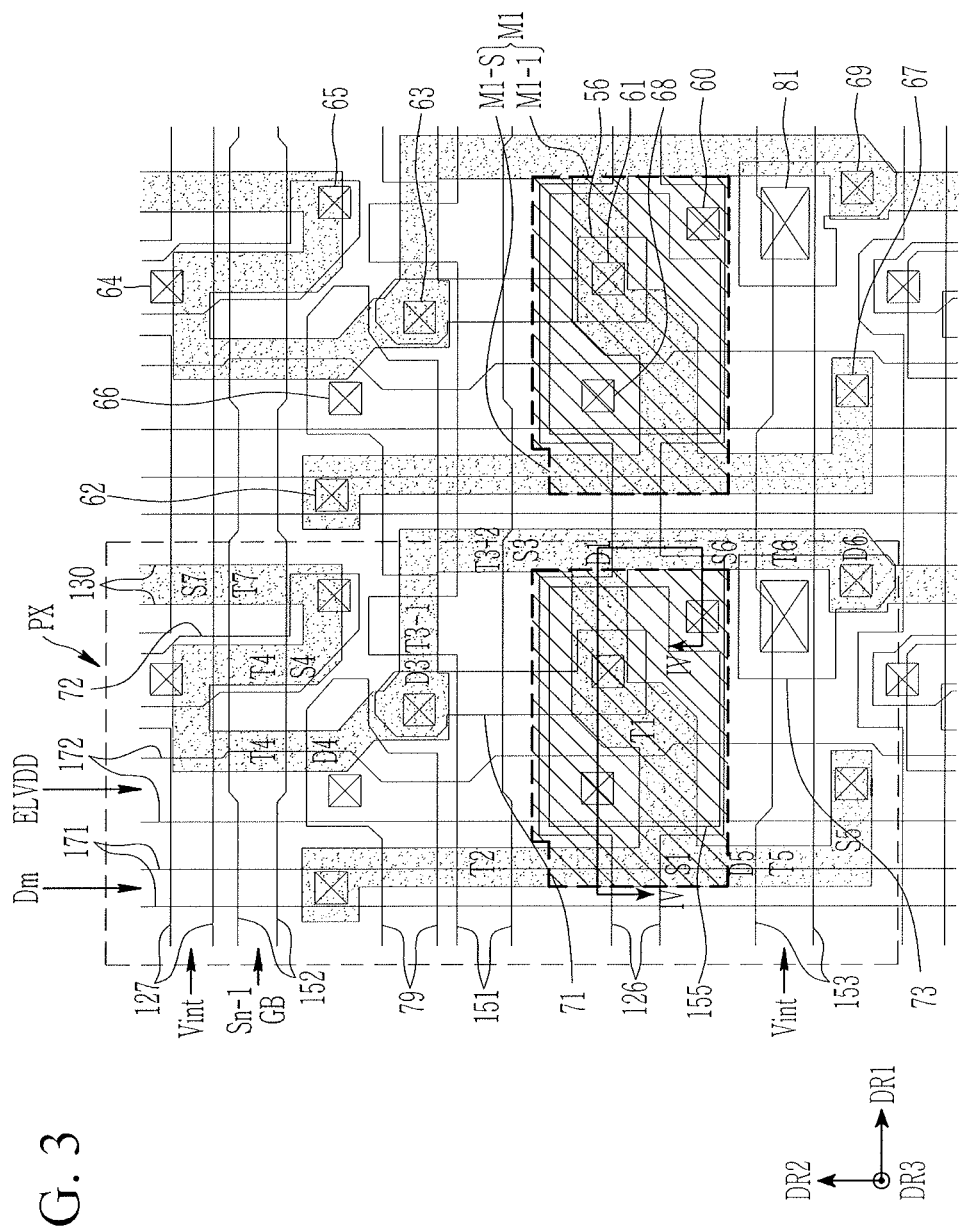
FIG. 3 illustrates a layout view of a pixel area of an organic light emitting diode display according to an exemplary embodiment.
Figure 4:
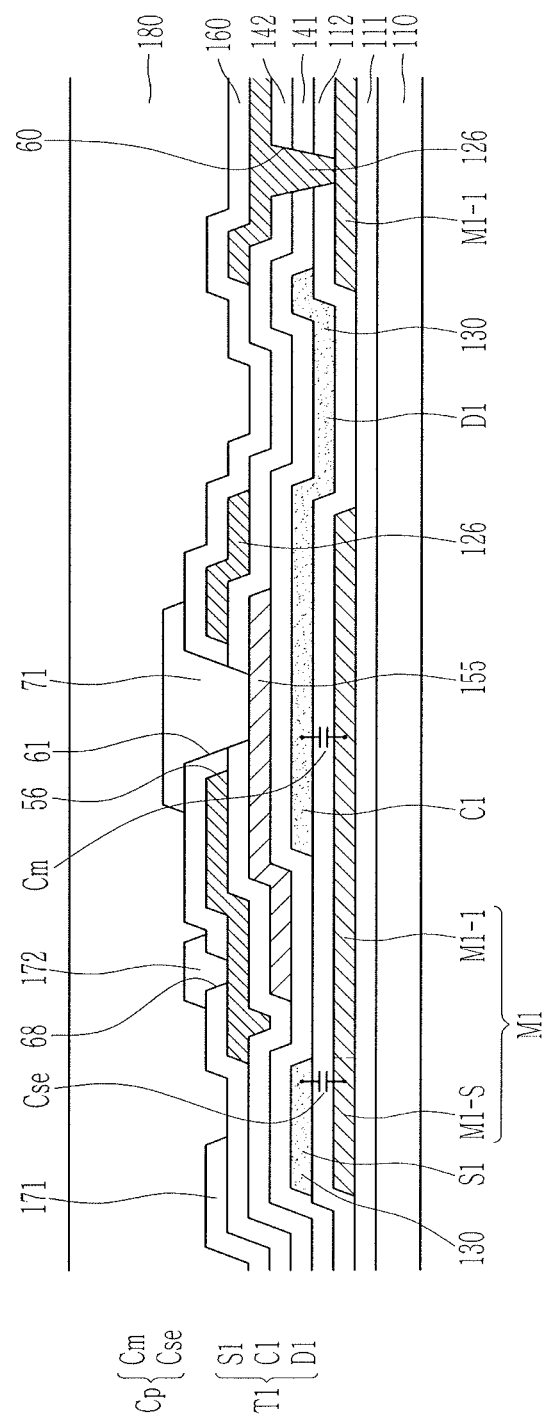
FIG. 4 illustrates a cross-sectional view taken along a line IV-IV of FIG. 3.
Figure 5:
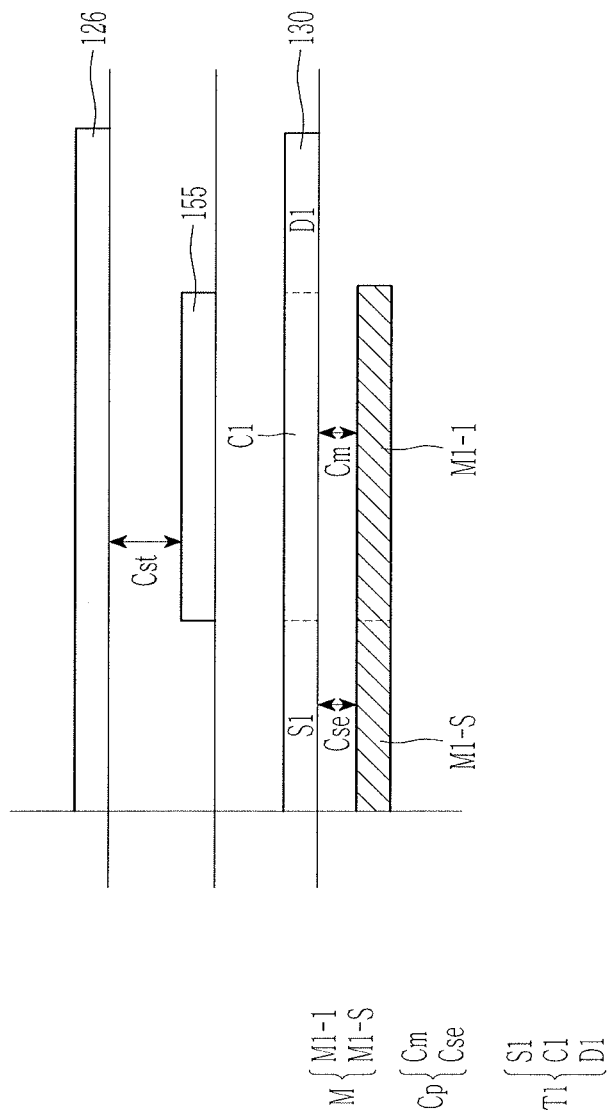
FIG. 5 illustrates a schematic cross-sectional view that illustrates an interlayer structure of some thin film layers of an organic light emitting diode display according to an exemplary embodiment.

Hereinafter, a stacked structure of an organic light emitting diode display according to an exemplary embodiment will be described with reference to FIG. 3 to FIG. 5. FIG. 3 illustrates a layout view of a pixel area of an organic light emitting diode display according to an exemplary embodiment, FIG. 4 illustrates a cross-sectional view taken along a line IV-IV of FIG. 3, and FIG. 5 is a schematic cross-sectional view that schematically illustrates an interlayer structure of some thin film layers of an organic light emitting diode display according to an exemplary embodiment.

First, referring to FIG. 3, as well as FIG. 1, according to the present exemplary embodiment, the organic light emitting diode display includes the scan line 151, the previous-stage scan line 152, the light emission control line 153, and the voltage line 127, which extend mainly along the first direction DR1, to respectively transfer a scan signal Sn, a previous-stage scan signal S(n−1), a light emission control signal EM, and an initialization voltage Vint. A bypass signal GB is transferred through the previous-stage scan line 152. The organic light emitting diode display includes a data line 171 and a driving voltage line 172 extending along the second direction DR2 that intersects the first direction DR1 to transfer a data voltage Dm and a driving voltage ELVDD, respectively.

The light emitting diode display includes the driving transistor T1, the second transistor T2, the third transistor T3, the fourth transistor T4, the fifth transistor T5, the sixth transistor T6, the seventh transistor T7, the storage capacitor Cst, and the organic light-emitting diode OLED. In the exemplary embodiment of FIG. 3, the light emitting diode display further includes the overlap layer M1 that overlaps a semiconductor layer 130 of the driving transistor T1.

The overlap layer M1 may be formed of a metal having a conductive characteristic or a semiconductor material having a conductive characteristic equivalent thereto. The overlap layer M1 may be between the semiconductor layer 130 and the substrate 110, e.g., a substrate formed of a plastic, a polyimide (PI), and the like. In addition, the overlap layer M1 may overlap a channel region of the driving transistor T1 in a plan view, e.g., along the third direction DR3, and may overlap at least a portion of other parts of the driving transistor T1.

Referring to FIG. 3, the overlap layer M1 includes a base portion M1-1 and a first extension M1-S. The overlap layer M1 is indicated by a thick dotted line in FIG. 3.

The base portion M1-1 overlaps the channel of the driving transistor T1, a portion of the first electrode S1, and a portion of the second electrode D1. A left end of the base portion M1-1 may be connected to the first extension M1-S and a right end thereof may overlap a portion of the second electrode D1 of the driving transistor T1. The right end of the base portion M1-1 does not overlap an entirety of the semiconductor layer 130 including the second electrode D1 of the driving transistor T1, the first electrode S3 of the third transistor T3, and the sixth electrode T6 of the sixth transistor T6.

The first extension M1-S is a portion where the overlap layer M1 extends along the first direction DR1 to overlap the first electrode S1 of the driving transistor T1. In this case, the first extension M1-S may cover an entirety of the semiconductor layer 130 including the first electrode S1 of the driving transistor T1 and a portion of the second transistor T2. Particularly, in the present exemplary embodiment, the first extension M1-S has a left side that coincides with a left side of the semiconductor layer 130 including the first electrode S1 of the driving transistor T1 and the second transistor T2.

Referring to FIG. 3, each channel of the driving transistor T1, the second transistor T2, the third transistor T3, the fourth transistor T4, the fifth transistor T5, the sixth transistor T6, and the seventh transistor T7 is in the semiconductor layer 130 which extends longitudinally. In addition, at least portions of the first and second electrodes of the transistors T1, T2, T3, T4, T5, T6, and T7 are in the semiconductor layer 130.

The semiconductor layer 130 is shaded in FIG. 3 to be easily distinguished from other layers. The semiconductor layer 130 may be bent in various shapes other than as shown in FIG. 3. The semiconductor layer 130 may include an oxide semiconductor or a polycrystalline semiconductor made of a polysilicon.

The semiconductor layer 130 includes a channel doped with an N-type impurity or a P-type impurity, and a first doped region and a second doped region disposed at opposite sides of the channel and having a higher doping concentration than the channel. The first doped region and the second doped region correspond to the first electrode and the second electrode of the transistors T1, T2, T3, T4, T5, T6, and T7, respectively. When one of the first and second doped regions is the source region, the other region corresponds to the drain region. In addition, regions between the first electrodes and the second electrodes of different transistors may be doped in the semiconductor layer such that the transistors may be electrically connected to each other.

Examples of impurities to be doped into the channel may include phosphorus (P), arsenic (As), antimony (Sb), boron (B), aluminum (Al), indium (Al), and the like. When the impurities include phosphorus, arsenic, antimony, and the like, the transistors may be n-type thin film transistors (TFTs) in which the electrons are carriers. When the impurities include boron, aluminum, indium, gallium, and the like, the transistors may be n-type thin film transistors (TFTs) in which the holes are carriers.

Each channel of the transistors T1, T2, T3, T4, T5, T6, and T7 overlaps a gate electrode of each of the transistors T1, T2, T3, T4, T5, T6, and T7, and is between the first electrode and the second electrode of each of the transistors T1, T2, T3, T4, T5, T6, and T7. The transistors T1, T2, T3, T4, T5, T6, and T7 may have substantially a same stacked structure. Hereinafter, the driving transistor T1 will be described in detail, and the remaining transistors T2, T3, T4, T5, T6, and T7 will be briefly described.

A gate electrode 155 of the driving transistor T1, e.g., the first gate electrode, overlaps the channel in a plan view, e.g., partially overlaps the channel along the third direction DR3. The first electrode S1 and the second electrode D2 are at opposite sides of the channel, respectively. An insulated extension of a storage line 126 is on the gate electrode 155. The extension of the storage line 126 overlaps the gate electrode 155, with a second gate insulating layer interposed therebetween in a plan view to constitute a storage capacitor Cst. The extension of the storage line 126 serves as a first storage electrode E1 of the storage capacitor Cst (see FIG. 1), and the gate electrode 155 serves as a second storage electrode E2 (see FIG. 1). The extension of the storage line 126 has an opening 56 such that the gate electrode 155 may be connected to a first data connecting member 71. In the opening 56, an upper surface of the gate electrode 155 and the first data connecting member 71 are electrically connected to each other through an opening 61. The first data connecting member 71 is connected to the second electrode D3 of the third transistor T3 to connect the gate electrode 155 of the driving transistor T1 to the second electrode D3 of the third transistor T3.

The overlap layer M1 overlaps the semiconductor layer 130 of the driving transistor T1. The overlap layer M1 includes a base portion M1-1 and a first extension M1-S.

The base portion M1-1 overlaps the channel of the semiconductor layer 130 of the driving transistor T1, at least a portion of the first electrode S1, and at least a portion of the second electrode D1. In addition, the base portion M1-1 may be formed to overlap the first storage electrode (E1 in FIG. 1) of the capacitor Cst, which is an extended portion of the gate electrode 155 and the storage line 126.

The first extension M1-S is a portion that extends from the base portion M1-1 to the first electrode S1 of the driving transistor T1 by a predetermined width, e.g., along a first direction DR1, and overlaps the semiconductor layer 130 including the second transistor T2 and the first electrode S1. As illustrated in FIG. 3, a left side of the first extension M1-S coincides with a left side of the semiconductor layer 130. In other words, the first extension M1-S may fully overlap the first electrode S1 along the third direction DR3 and may not extend along a second direction DR2 as far as the base portion M1-1.

A gate electrode of the second transistor T2 may be a portion of the scan line 151. The data line 171 is connected to the first electrode of the second transistor T2 through an opening 62, and the first electrode S2 and the second electrode D2 may be disposed on the semiconductor layer 130.

The third transistor T3 may include two transistors T3-1 and T3-2 adjacent to each other and coupled in series. A gate electrode of the two transistors T3-1 and T3-2 may be a portion of the scan line 151 or a portion that protrudes upward from the scan line 151. Such a structure may be referred to as a dual-gate structure and may prevent a leakage current.

When the structure in which two transistors are connected in series is briefly described as one third transistor T3, it may be described that the first electrode S3 (corresponding to the first electrode S3-2 of the third-second transistor T3-2) of the third transistor T3 is connected to the first electrode S6 of the sixth transistor T6 and the second electrode D1 of the driving transistor T1. In addition, the second electrode D3 (corresponding to the second electrode D3-1 of the third-first transistor T3-1) is connected to the first data connecting member 71 through an opening 63.

The fourth transistor T4 may include two fourth transistors T4 at a portion where the previous-stage scan line 152 and the semiconductor layer 130 intersect. A gate electrode of the second transistor T2 may be a portion of the previous-stage scan line 152. A first electrode S4 of a first fourth transistor T4 is connected to a second electrode D4 of a second fourth transistor T4. Such a structure may be referred to as a dual gate structure and may prevent a leakage current. A second data connecting member 72 is connected to the first electrode S4 of the fourth transistor T4 through an opening 65. The first data connecting member 71 is connected to the second electrode D4 of the fourth transistor T4 through an opening 63.

As such, a dual-gate structure may be used by using the third transistor T3 and the fourth transistor T4 to effectively prevent a leakage current by blocking an electron movement path of the channel in an off-state.

A gate electrode of the fifth transistor T5 may be a portion of the light emission control line 153. The driving voltage line 172 is connected to the first electrode S5 of the fifth transistor T5 through an opening 67. The second electrode D5 of the fifth transistor T5 is connected to the first electrode S1 of the driving transistor T1 through the semiconductor layer 130.

A gate electrode of the sixth transistor T6 may be a portion of the light emission control line 153. The third data connecting member 73 is connected to the second electrode D6 of the sixth transistor T6 through an opening 69, and the first electrode S6 is connected to the second electrode D1 of the driving transistor through the semiconductor layer 130.

The gate electrode of the seventh transistor T7 may be a portion of the previous-stage scan line 152. The third data connecting member 73 is connected to the first electrode S7 of the seventh transistor T7 through an opening 81, and the first electrode S7 is connected to the second electrode D6 of the sixth transistor T6. The second electrode D7 of the fifth transistor T7 is connected to the first electrode S4 of the fourth transistor T4.

The storage capacitor Cst includes the first storage electrode E1 and the second storage electrode E2 that overlap each other, with a second gate insulating layer 142 interposed therebetween. The second storage electrode E2 may correspond to the gate electrode 155 of the driving transistor T1 and the first storage electrode E1 may be the extension of the storage line 126. Herein, the second gate insulating layer 142 (see FIG. 4) serves as a dielectric material, and capacitance is determined by the voltage charged in the storage capacitor Cst and a voltage between the first and second storage electrodes E1 and E2. It is possible to secure a space in which the storage capacitor Cst can be formed in the space that is narrowed by the channel of the driving transistor T1 occupying a large area within the pixel by using the gate electrode 155 as the second storage electrode E2.

The driving voltage line 172 is connected to the first storage electrode E1 through an opening 68. Accordingly, the storage capacitor Cst stores a charge corresponding to a difference between the driving voltage ELVDD transferred to the first storage electrode E1 through the driving voltage line 172 and the gate voltage Vg of the gate electrode 155.

In addition, the first storage electrode E1, which is an extension of the storage line 126, is connected to the overlap layer M1 through an opening 60. The first storage electrode E1 receives the driving voltage ELVDD through the driving voltage line 172 connected through the opening 68. Thus, the overlap layer M1 receives the driving voltage ELVDD through the first storage electrode E1.

The second data connecting member 72 is connected to the initialization voltage line 127 through the opening 64. A pixel electrode is connected to the third data connecting member 73 through the opening 81.

The organic light emitting diode OLED includes a pixel electrode connected through the opening 81, an organic emission layer, and a common electrode.

A parasitic capacitor control pattern 79 may be above the third node N3 of the third transistor T3. A parasitic capacitor exists in the pixel, and an image quality characteristic thereof may vary when a voltage applied to the parasitic capacitor changes. The driving voltage line 172 is connected to the parasitic capacitor control pattern 79 through an opening 66. As a result, the image quality characteristic may be prevented from being varied by applying the driving voltage ELVDD having a constant DC voltage to the parasitic capacitor. The parasitic capacitor control pattern 79 may be in a different region than the illustrated position, and a voltage other than the driving voltage ELVDD may be applied thereto.

A first end of the first data connecting member 71 is connected to the gate electrode 155 through the opening 61, and a second end thereof is connected to the second electrode D3 of the third transistor T3 and the second electrode D4 of the fourth transistor T4 through the opening 63.

A first end of the second data connecting member 72 is connected to the first electrode S4 of the fourth transistor T4 through the opening 65, and a second end thereof is connected to the initialization voltage line 127 through the opening 64.

A first end of the third data connecting member 73 is connected to the pixel electrode through the opening 81, and a second end is connected to the second electrode D6 of the sixth transistor T6 through the opening 69.

Specific shapes of the semiconductor layer 130 and the plurality of signal lines 127, 151, 152, 153, 158, 171, 172, and 741 may be varied from those illustrated in FIG. 3, and may be additionally etched to have different thicknesses.

Hereinafter, a cross-sectional structure of an organic light emitting diode display according to an exemplary embodiment will be described depending on a stacking order thereof with reference to FIG. 4 as well as FIG. 3. The description of the same contents as those described in FIG. 3 will be omitted.

Referring to FIG. 4, according to the present exemplary embodiment, the organic light emitting diode display includes a substrate 110. The substrate 110 may be formed of a flexible material, e.g., a plastic, a polyimide (PI), and the like.

A barrier layer 111 is on the substrate 110. The barrier layer 111 may include an inorganic insulating material, e.g., a silicon oxide, a silicon nitride, an aluminum oxide, and the like, or an organic insulating material, e.g., a polyimide acryl. The barrier layer 111 prevents impurities from flowing into the transistor and flattens one surface of the substrate 110. According to an exemplary embodiment, the barrier layer 111 may be omitted.

The overlap layer M1 is on the barrier layer 111. The overlap layer M1 may be formed of a metal having a conductive characteristic or a semiconductor material having a conductive characteristic equivalent thereto. The metal may include, e.g., molybdenum, chromium, tantalum, titanium, copper, an alloy thereof, and the like. The overlap layer M1 may be a single layer or a multilayer.

A buffer layer 112 is on the overlap layer M1. The buffer layer 112 may be an inorganic insulating material, e.g., a silicon oxide, a silicon nitride, an aluminum oxide, and the like, and may also include an organic insulating material, e.g., a polyimide, a polyacryl (epoxy), or the like.

The semiconductor layer 130 of the driving transistor T1 is on the buffer layer 112. The semiconductor layer 130 includes a channel C1, a first electrode S1, and a second electrode D1. The detailed contents are the same as described above, and thus will be omitted.

The overlap layer M1 overlaps the semiconductor layer 130 of the driving transistor T1. In particular, the overlap layer M1 overlaps the channel C1 of the semiconductor layer 130 of the driving transistor T1 and the first electrode S1 at one side of the channel C1. According to the present exemplary embodiment, the overlap layer M1 may overlap a portion of the second electrode D1 of the driving transistor T1.

The overlap layer M1 may completely overlap the gate electrode 155 or the storage line 126 in a plan view, and may have a region that protrudes to be connected to another layer. The overlap layer M1 may be formed to have any form overlapping the first transistor T1, e.g., the overlap layer M1 not be continuous and may overlap separate portions of the first transistor T1.

In the present exemplary embodiment, the overlap layer M1 includes a base portion M1-1 and a first extension M1-S. The base portion M1-1 is a region that overlaps the channel C1 of the driving transistor T1. A left end of the base portion M1-1 may be connected to the first extension M1-S, and a right end thereof may be formed to not overlap the semiconductor layer 130 including the second electrode D1 of the driving transistor T1. However, according to an exemplary embodiment, the right end of the base portion M1-1 may overlap at least a portion of the second electrode D1.

The first extension M1-S is a portion where the overlap layer M1 extends to the first electrode S1 of the driving transistor T1 to overlap the first electrode S1. Herein, the first extension M1-S is extended so as to completely overlap the first electrode S1 of the driving transistor T1 disposed above the first extension M1-S. In other words, the first extension M1-S may be connected to the left end of the base portion M1-1 so that the left end of the first extension M1-S coincides, e.g., aligned with the left end of the first electrode S1 of the driving transistor T1.

Herein, the additional storage capacitor Cp is formed by the overlap layer M1 and the semiconductor layer 130 of the driving transistor T1. The additional storage capacitor Cp includes a first additional storage capacitor Cm and a second additional storage capacitor Cse.

The first additional storage capacitor Cm is formed by the base portion M1-1 of the overlap layer M1 and the channel C1 of the driving transistor T1. The additional storage capacitor Cse is formed by the first extension M1-S of the overlap layer M1 and the first electrode S1 of the driving transistor T1. As a result, the additional storage capacitor Cp is formed in addition to the storage capacitor Cst, so that additional capacitance is generated, thereby increasing the total capacitance. Accordingly, the instant afterimage is reduced and the afterimage characteristic is improved in the organic light emitting diode display according to the present exemplary embodiment.

In the meantime, as the overlap layer M1 does not extend along the first direction to completely overlap the second electrode D1 of the driving transistor T1, a certain distance from an overlap layer M1 at a pixel that is adjacent thereto is provided, thereby preventing deterioration of the afterimage characteristic even when the total capacitance is increased. Thus, the afterimage characteristic may be ameliorated as much as possible.

A first gate insulating layer 141 covering the semiconductor layer 130 is on the semiconductor layer 130. A first gate conductor including the scan line 151, the previous-stage scan line 152, a light emission control line 153, and the gate electrode (a second storage electrode E2) of the transistors T1, T2, T3, T4, T5, T6, and T7 is on the first gate insulating layer 141.

A second gate insulating layer 142 covering the first gate conductor is on the first gate conductor. The first gate insulating layer 141 and the second gate insulating layer 142 may be formed of a material such as a silicon nitride, a silicon oxide, and an aluminum oxide.

A second gate conductor including the storage line 126, the first storage electrode E1, the initialization voltage line 127, and the parasitic capacitor control pattern 79 is on the second gate insulating layer 142.

An interlayer insulating layer 160 covering the first gate conductor is on the first gate conductor. The interlayer insulating layer 160 may be formed of a material such as a silicon nitride, a silicon oxide, and an aluminum oxide, and may be formed of an organic insulating material.

A data conductor including a data line 171, a driving voltage line 172, a first data connecting member 71, a second data connecting member 72, and a third data connecting member 73 is on the interlayer insulating layer 160.

A passivation layer 180 covering the data conductor is on the data conductor. The passivation layer 180 may include an organic insulating material.

A pixel electrode is on the passivation layer 180. The pixel electrode is connected to the third data connecting member 73 through the opening 81 in the passivation layer 180. A partition wall or pixel defining layer is on the passivation layer 180 and the pixel electrode. The partition wall has an open portion that overlaps the pixel electrode, and an organic light emitting layer is in the open portion. A common electrode is on the organic emission layer and the partition wall. The pixel electrode, the organic emission layer, and the common electrode constitute an organic light emitting diode OLED.

According to an implementation, the pixel electrode may be an anode, i.e., a hole injection electrode, and the common electrode may be a cathode, i.e., an electron injection electrode. Conversely, the pixel electrode may be the cathode and the common electrode may be the anode. When holes and electrons are injected from the pixel electrode and the common electrode into the organic emission layer, excitons formed by combining the injected holes and electrons are emitted when they fall from an excited state to a ground state.

The scan line 151, the previous-stage scan line 152, and the light emission control line 153 that constitute the first gate conductor extend in the first direction DR1. The storage line 126 and the initialization voltage line 127 that constitute the second gate conductor extend in the first direction DR1. The data line 171 and the driving voltage line 172 that constitute the data conductors extend in the second direction DR2.

The data line 171 is connected with the first electrode S2 of the second transistor T2 through the opening 62 in the first gate insulating layer 141, the second gate insulating layer 142, and the interlayer insulating layer 160.

The driving voltage line 172 is connected to the first electrode S5 of the fifth transistor T5 through the opening 67 in the first gate insulating layer 141, the second gate insulating layer 142, and the interlayer insulating layer 160, is connected with the extension (the first storage electrode E1) of the storage line 126 though the opening 68 in the interlayer insulating layer 160, and is connected with the parasitic capacitor control pattern 79 through the opening 66 in the interlayer insulating layer 160.

A first end of the first data connecting member 71 is connected with the gate electrode 155 through the opening 61 in the second gate insulating layer 142 and the interlayer insulating layer 160. A second end of the first data connecting member 71 is connected with the second electrode D3 of the third transistor T3 and the second electrode D4 of the fourth transistor T4 though an opening 63 in the first gate insulating layer 141, the second gate insulating layer 142, and the interlayer insulating layer 160.

A first end of the second data connecting member 72 is connected with the first electrode S4 of the fourth transistor T4 through the opening 65 in the first gate insulating layer 141, the second gate insulating layer 142, and the interlayer insulating layer 160. A second end of the second data connecting member 72 is connected with the initialization voltage line 127 through an opening 64 in the interlayer insulating layer 160.

The third data connecting member 73 is connected with the second electrode of the sixth transistor T6 through an opening 69 in the first gate insulating layer 141, the second gate insulating layer 142, and the interlayer insulating layer 160.

In this case, the overlap layer M1 may be connected to the extension (the first storage electrode E1) of the storage line 126 through the opening 60. The driving voltage line 172 is connected to the storage line 126 through the opening 68 such that the driving voltage ELVDD may be applied to the storage line 126. Accordingly, the driving voltage ELVDD may be applied to the overlap layer M1 through the storage line 126.

The driving transistor T1 and the overlap layer M1 receiving the driving voltage ELVDD form the additional storage capacitor Cp as described above. The first additional storage capacitor Cm is formed by the base portion M1-1 of the overlap layer M1 and the channel C1 of the driving transistor T1. The additional storage capacitor Cse is additionally formed by the first extension M1-S of the overlap layer M1 and the first electrode S1 of the driving transistor T1. As a result, the entire capacitance is increased and the afterimage is reduced, so that the afterimage characteristic may be ameliorated.

When the driving voltage ELVDD is uniformly applied to the overlap layer M1, a potential of the overlap layer M1 may be constantly maintained to prevent an effect on the surrounding electrodes, and a light-blocking function may be provided for the driving transistor T1 overlapped therewith so as to prevent a leakage current and characteristic deterioration of the driving transistor T1.

An encapsulation layer may be on the common electrode to protect the organic light emitting diode OLED. The encapsulation layer may be in contact with the common electrode or may be spaced apart from the common electrode. The encapsulation layer may be a thin film encapsulation layer in which an organic layer and an inorganic layer are stacked, e.g., may include a triple layer including an inorganic layer, an organic layer, and an inorganic layer. A capping layer and a functional layer may be between the common electrode and the encapsulation layer.

Hereinafter, a relationship between the overlap layer and the semiconductor layer according to an exemplary embodiment will be described with reference to FIG. 4 and FIG. 5.

FIG. 5 is a schematic cross-sectional view that illustrates an interlayer structure of some thin film layers of an organic light emitting diode display according to an exemplary embodiment. In the organic light emitting diode display according to the exemplary embodiment of FIG. 4, the overlap layer M1, the semiconductor layer 130, the gate electrode 155, and the storage line 126 are illustrated in the cross-sectional view of FIG. 5, and other layers are omitted.

Referring to FIG. 5, the overlap layer M1 is illustrated. A buffer layer 112 (see FIG. 4) may be on the overlap layer M1.

The semiconductor layer 130 of the driving transistor T1 is on the overlap layer M1. As described above in FIG. 3, the semiconductor layer 130 of the driving transistor T1 includes a channel C1, and the first electrode S1 and the second electrode D1 at opposite sides of the channel C1.

The overlap layer M1 includes the base portion M1-1 and the first extension M1-S. The base portion M1-1 overlaps, e.g., completely overlaps, the channel C1 of the semiconductor layer 130 of the driving transistor T1 along the third direction DR3. The first extension M1-S is a region where the overlap layer M1 overlaps, e.g., completely overlaps, the first electrode S1 of the driving transistor T1 along the third direction DR3.

Herein, the additional storage capacitor Cp is formed by the overlap layer M1, the semiconductor layer 130 of the driving transistor T1, and the buffer layer 112 therebetween (see FIG. 4). The additional storage capacitor Cp includes a first additional storage capacitor Cm formed by the base portion M1-1 and a second additional storage capacitor Cse formed by the first extension M1-S. Therefore, the additional storage capacitor Cp including the first and second additional storage capacitors Cm and Cse is formed in addition to the storage capacitor Cst, thereby increasing the total capacitance and reducing the afterimage.

In this case, the overlap layer M1 does not extend to cover the second electrode D1 of the driving transistor. This is to prevent problems, e.g., a wire short-circuit, that may arise when the overlap layer M1 is in an adjacent pixel or the inability to secure a minimum design margin when the overlap layer M1 also overlaps an entirety of the second electrode D1. In an implementation, the overlap layer M1 may partially extend to the second electrode D1 to form a fourth additional storage capacitor Cde to be described later.

The first gate insulating layer 141 (see FIG. 4) may be on the semiconductor layer 130 and the gate electrode 155 is thereon. The gate electrode 155 may overlap a channel C1 region of the semiconductor layer 130 disposed therebelow.

A second gate insulating layer 142 (see FIG. 4) may be on the gate electrode 155, and the storage line 126 may be thereon. The gate electrode 155, the storage line 126, and the second gate insulating layer 142 therebetween constitute the storage capacitor Cst. As described in FIG. 1, the gate electrode 155 may correspond to the second storage electrode E2 of the driving transistor T1 and an extension of the storage line 126 may correspond to the first storage electrode E1. The second gate insulating layer 142 serves as a dielectric material, and a capacitance is determined by the voltage charged in the storage capacitor Cst and a voltage between the first and second storage electrodes E1 and E2.

Particularly, a left side of the first extension M1-S of the overlap layer M1 may coincide with a left side of the semiconductor layer 130 including the second transistor T2 and the first electrode S1. In other words, the predetermined width by which the first extension M1-S extend along the first direction DR1 over the first electrode S1 may be equal to widths of the semiconductor layer 130 including the second transistor T2 and the first electrode S1. In other words, left edges of the first extension M1-S and the first electrode S1 may be co-planar along the third direction DR3.

In addition, as described above, the overlap layer M1 does not extend to the second electrode D1 of the driving transistor T1 to prevent the overlap layer M1 from extending over the adjacent pixel. In particular, along the third direction DR3, the base portion M1-1 may have a left edge that is coplanar with a left edge of the semiconductor layer 130 including the first electrode S1 of the driving transistor T1 and the second transistor T2. The base portion M1-1 may also have a right edge that is coplanar with the boundary between the second electrode D1 and the channel C1. Accordingly, the area of the overlap layer M1 ameliorates the afterimage characteristic while increasing the capacitance thereof by including the second additional storage capacitor Cse. As a result, the total capacitance Cst+Cp is optimized, whereby the afterimage is reduced to the maximum, and the afterimage characteristic is optimized.

Figure 6:
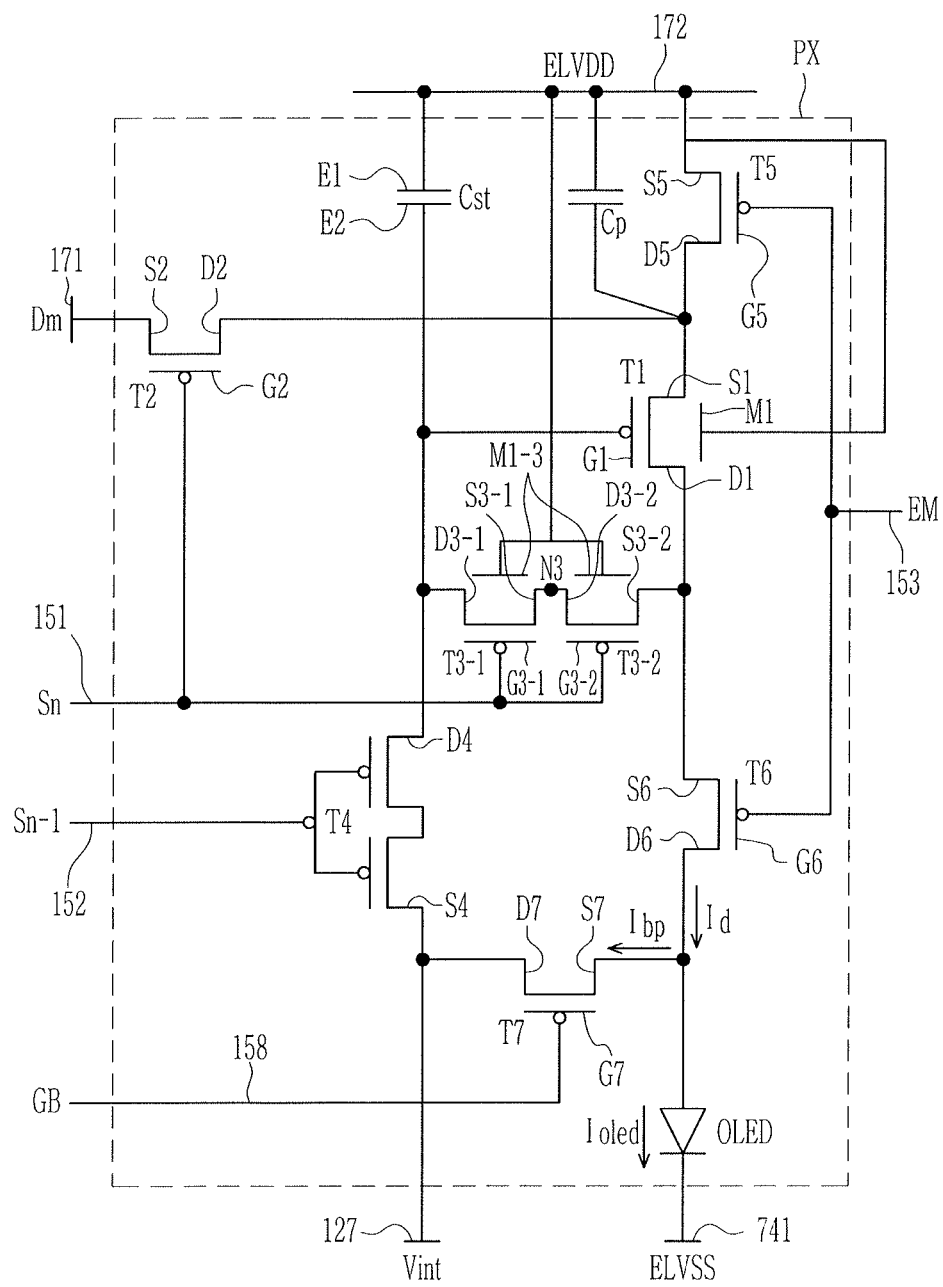
FIG. 6 illustrates an equivalent circuit diagram of one pixel of an organic light emitting diode display according to an exemplary embodiment.

Hereinafter, driving of a pixel of an organic light emitting diode display according to an exemplary embodiment will be described with reference to FIG. 6. FIG. 6 illustrates an equivalent circuit diagram of one pixel of an organic light emitting diode display according to an exemplary embodiment. In FIG. 6, the description of the same constituent elements as those of the above-described constituent elements is omitted, and differences are mainly described below.

Herein, each of the third transistor T3 and the fourth transistor T4 is illustrated as a structure including two transistors connected in series with each other. Herein, this series-connected structure indicates a structure in which gate electrodes of two transistors T3-1 and T3-2 are connected to receive a same signal, and an output of a first transistor is applied to an input of a second transistor.

A gate electrode G3-1 of the third-first transistor T3-1 and a gate electrode G3-2 of the third-second transistor T3-2 are connected to each other, and the first electrode S3-1 of the third-first transistor T3-1 and the second electrode D3-2 of the third-second transistor T3-2 are also connected to each other. The fourth transistor T4 may also include two transistors connected in series or may be a single transistor.

As in the aforementioned exemplary embodiment, a dual-gate structure may be used by using the third transistor T3 and the fourth transistor T4 to effectively prevent occurrence of a leakage current by blocking an electron movement path of the channel in an off-state.

In the exemplary embodiment of FIG. 6, the overlap layer M1 further includes a second extension M1-3 in addition to the base portion M1-1 and the first extension M1-S. The second extension M1-3 may overlap the third transistor T3 and may receive the driving voltage ELVDD, similarly to the base portion M1-1. The potential may be prevented from being changed by injection of a specific charge into the overlap layer M1 by applying a constant voltage, e.g., the driving voltage ELVDD in the present exemplary embodiment, to the overlap layer M1.

The second extension M1-3 of the overlap layer M1 is below the semiconductor layer 130 of the third transistor T3 and overlaps the semiconductor layer 130 of the third transistor T3. Specifically, the second extension M1-3 of the overlap layer M1 is disposed at a side that is opposite to a gate electrode G3 of the driving transistor T3 with respect to the semiconductor layer 130 on which a channel of the driving transistor T1 is formed. The second extension M1-3 may also serve as a second gate electrode of the driving transistor T3.

Herein, the total capacitance may be increased to ameliorate the instant afterimage by forming the third additional storage capacitor by the third transistor T3 and the second extension M1-3 of the overlap layer M1 in addition to the second additional storage capacitor Cse formed in the aforementioned exemplary embodiment.

Figure 7:
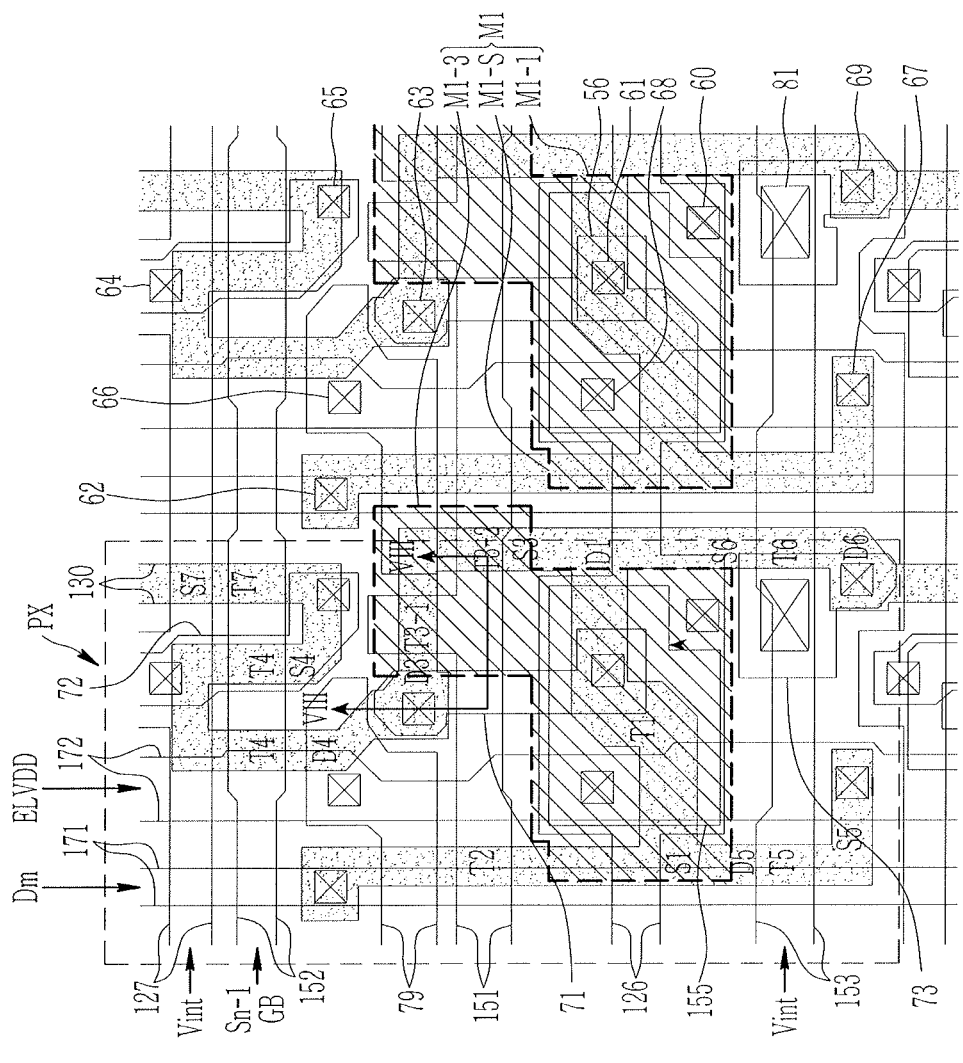
FIG. 7 illustrates a layout view of a pixel area of an organic light emitting diode display according to an exemplary embodiment.
Figure 8:
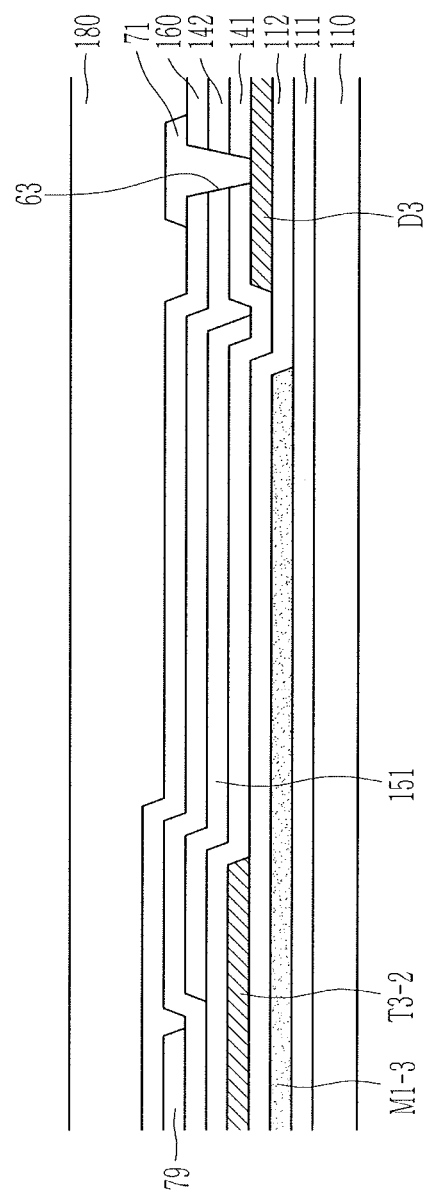
FIG. 8 illustrates a cross-sectional view taken along a line VIII-VIII FIG. 7.

Hereinafter, an organic light emitting diode display according to an exemplary embodiment will be described with reference to FIG. 7 and FIG. 8. FIG. 7 illustrates a layout view of a pixel area of an organic light emitting diode display according to an exemplary embodiment, and FIG. 8 illustrates a cross-sectional view taken along a line VIII-VIII FIG. 7. In FIG. 7 and FIG. 8, the description of the same constituent elements as those of the above-described constituent elements is omitted, and differences are mainly described below.

Referring to FIG. 7, the overlap layer M1 includes a base portion M1-1, the first extension M1-S, and the second extension M1-3. The description of the base portion M1-1 and the first extension M1-S is the same as that of the aforementioned exemplary embodiment and will not be repeated.

According to the present exemplary embodiment, the second extension M1-3 of the overlap layer M1 may overlap the third transistor T3. In the present exemplary embodiment, the second extension M1-3 may overlap both the third-first transistor T3-1 and the third-second transistor T3-2. The second extension M1-3 may overlap the third node N3 connected to two transistors T3-1 and T3-2 in the third transistor T3 in a plan view and may partially overlap other portions of the two transistors T3-1 and T3-2.

The second extension M1-3 is below the semiconductor layer 130 of the third transistor T3 and overlaps the semiconductor layer 130 of the third transistor T3. Specifically, the second extension M1-3 is at a side that is opposite to a gate electrode G3 of the driving transistor T3 with respect to the semiconductor layer 130 on which a channel of the driving transistor T1 is formed. As described above, the third transistor T3 may also serve as a second gate electrode of the driving transistor T3. According to another implementation, the overlap layer M1 may overlap at least one of the third-first transistor T3-1 and the third-second transistor T3-2.

Referring to FIG. 8, the organic light emitting diode display according to the present exemplary embodiment includes the substrate 110, the barrier layer 111, the second extension M1-3 of the overlap layer M1, the buffer layer 112, the semiconductor layer 130, the first gate insulating layer 141, the scan line 151, the second gate insulating layer 142, the parasitic capacitor control pattern 79, the first data connecting member 71, and the passivation layer 180.

The second extension M1-3 is formed of a metal having a conductive characteristic or a semiconductor material that is equivalent thereto, and is disposed between the substrate 110 formed of a plastic or a polyimide (PI) and the semiconductor layer 130 of the third transistor T3. In the present exemplary embodiment, the second extension M1-3 is formed to overlap the third-second transistor T3-2 and to not overlap the second electrode D3 of the third transistor T3.

The buffer layer 112 is on the second extension M1-3, and the semiconductor layer 130 of the third transistor T3 is on the buffer layer 112. The semiconductor layer 130 includes a channel, the first electrode S3, and the second electrode D3. The detailed contents are the same as described above, and thus will be omitted.

In the exemplary embodiment of FIG. 7 and FIG. 8, the third additional storage capacitor may be formed by the second extension M1-3 and the third transistor T3, thereby generating additional capacitance. As a voltage variation is buffered at the third node N3 by the additional capacitance, a signal variation at the third node N3 may be reduced, thereby improving general characteristics of the third transistor T3.

The first gate insulating layer 141 is on the third transistor T3 and the scan line 151 is thereon. The second gate insulating layer 142 is on the scan lines 151 and the parasitic capacitor control pattern 79 is thereon. The interlayer insulating layer 160 is on the parasitic capacitor control pattern 79 and the first data connecting member 71 is thereon.

The opening 63 in the first gate insulating layer 141, the second gate insulating layer 142, and the interlayer insulating layer 160 exposes a portion of the third transistor T3. The first data connecting member 71 may be connected to the third transistor T3 on the lower surface through the opening 63.

The second extension M1-3 may be integrally formed with the base M1-1 so as to receive the driving voltage ELVDD through the base M1-1 receiving the driving voltage ELVDD. According to an implementation, the second extension M1-3 may be formed separately from the base portion M1-1 or may be directly connected to the driving voltage line 172. According to an implementation, a different voltage may be applied to the second extension M1-3.

Hereinafter, characteristics according to examples and comparative examples will be described with reference to FIG. 9 to FIG. 12. As illustrated in FIG. 9 to FIG. 12, the overlap layer M1 includes the second extension M1-3 as in the exemplary embodiment of FIG. 6 to FIG. 8. Hereinafter, the description of the same constituent elements as those of the above-described constituent elements is omitted, and differences are mainly described below.

The following examples and comparative examples are provided in order to highlight characteristics of one or more embodiments, but it will be understood that the examples and comparative examples are not to be construed as limiting the scope of the embodiments, nor are the comparative examples to be construed as being outside the scope of the embodiments. Further, it will be understood that the embodiments are not limited to the particular details described in the examples and comparative examples.

Figure 9:
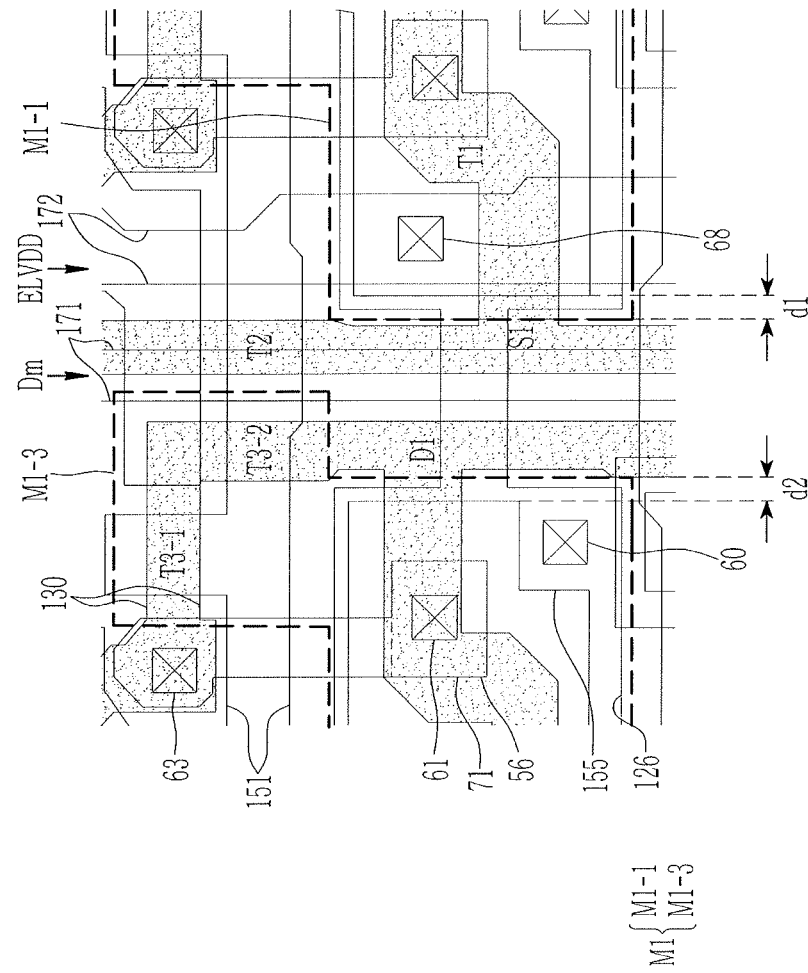
FIG. 9 illustrates an enlarged view of a portion of pixels of an organic light emitting diode display according to a comparative example.
Figure 10:
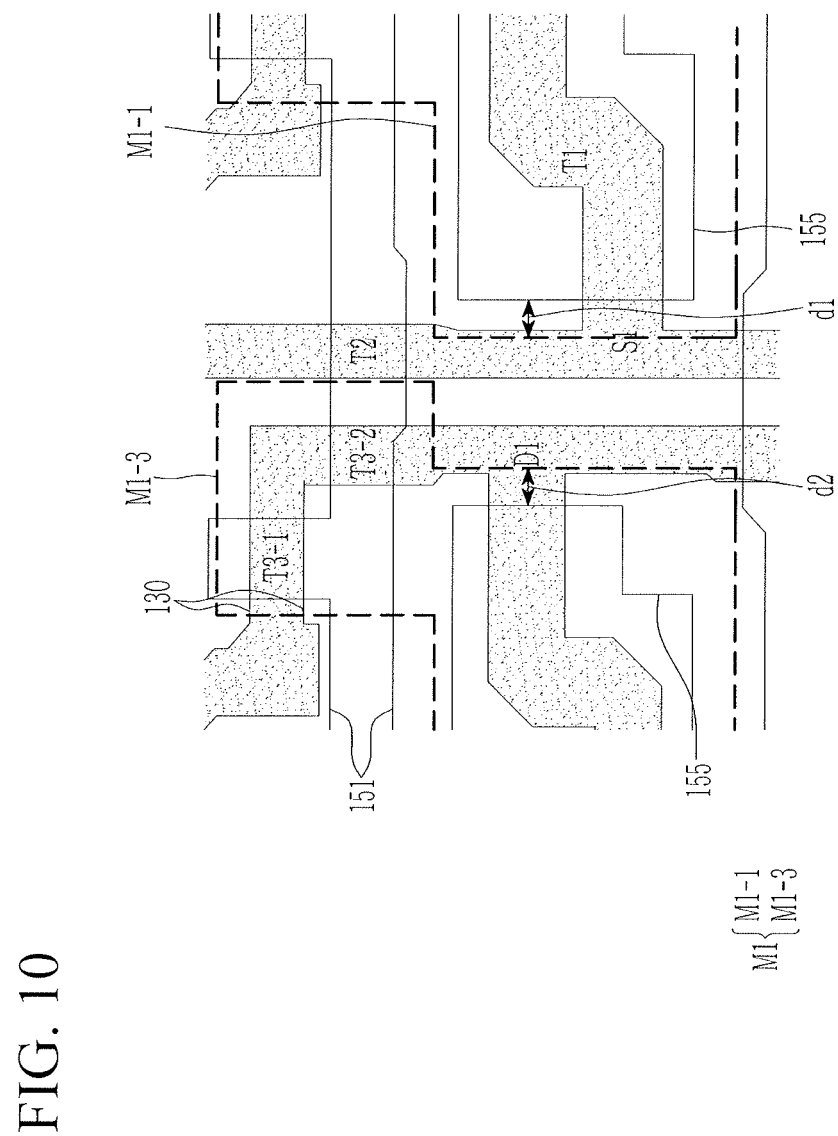
FIG. 10 and FIG. 11 illustrate enlarged views of a portion of pixels of an organic light emitting diode display according to examples.
Figure 11:
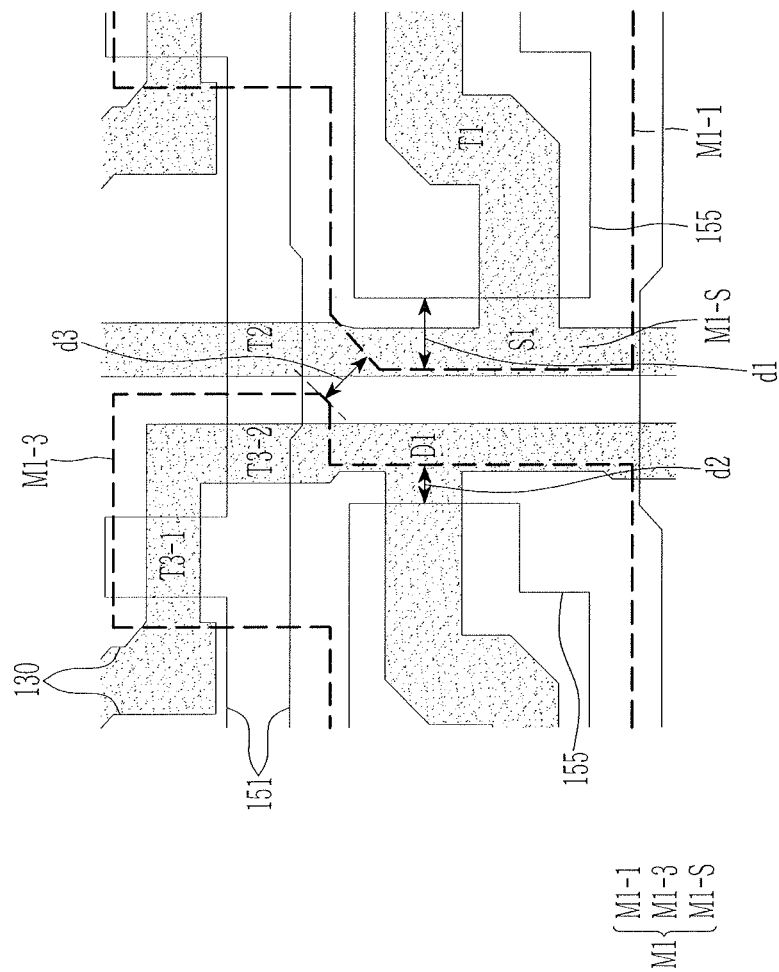
Figure 12:
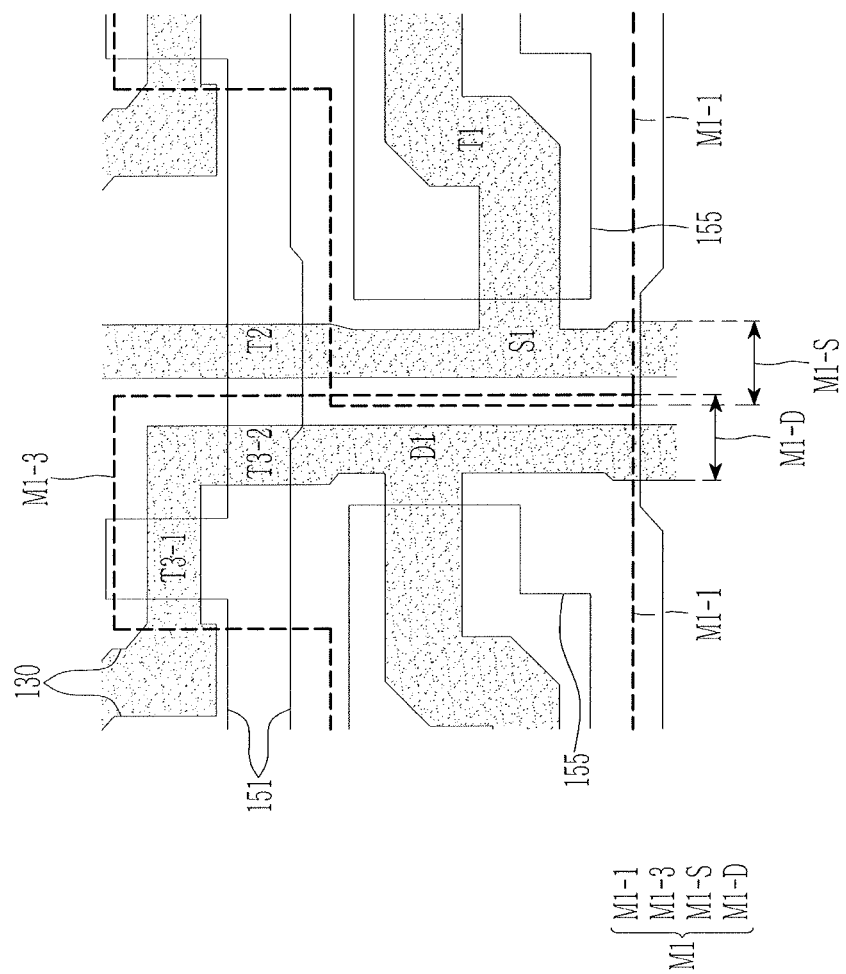
FIG. 12 illustrates an enlarged view of a portion of pixels of an organic light emitting diode display according to a comparative example.

FIG. 9 illustrates an enlarged view of a portion of pixels of an organic light emitting diode display according to a comparative example. FIG. 10 to FIG. 11 illustrate enlarged views of a portion of pixels of an organic light emitting diode display according to examples. FIG. 12 illustrates an enlarged view of a portion of pixels of an organic light emitting diode display according to another comparative example. In FIGS. 9 to 12, the effect of increasing the overlap area of the overlap layer is examined.

Tests according to the examples and the comparative examples were performed to compare afterimages. In the comparative examples and the examples, black and white were displayed separately for adjacent pixels, and white and black were displayed in reverse order after one frame. The degree of the afterimages after such processes are repeated is referred to as an instant afterimage.

In the comparative example of FIG. 9, the overlap layer M1 includes the base portion M1-1 and the second extension M1-3. The second storage electrode E2 corresponding to the gate electrode 155 and the first storage electrode E1 corresponding to the extension of the storage line 126 may form a storage capacitor Cst with a gate insulating layer therebetween.

The additional storage capacitor Cp may be formed by the overlap layer M1 and the semiconductor layer 130 of the driving transistor T1. The additional storage capacitor Cp includes a first additional storage capacitor Cm and a second additional storage capacitor Cse.

The base portion M1-1 of the overlap M1 may overlap the channel of the driving transistor T1 to form the first additional storage capacitor Cm. Further, the overlap layer M1 may only overlap a small portion of the first electrode S1 to form the second additional storage capacitor Cse and a small portion of the second electrode D1 to form a fourth additional storage capacitor Cde. In other words, the first extension M1-S is not included in the comparative example.

A distance between the left end of the gate electrode 155 and the left end of the base portion M1-1 is referred to as a first distance d1. A distance between the right end of the gate electrode 155 and the right end of the base portion M1-1 is referred to a second distance d2.

In the comparative example, the first distance d1 and the second distance d2 may have values in a range of 1 μm to 1.5 μm, for example, 1.25 μm. The overlap layers M1 between adjacent pixels do not overlap each other along the third direction DR3.

In this case, Table 1 below shows experimental values of capacitance and instant afterimage of each of the storage capacitors Cst, Cse, and Cde according to a reference that does not include any overlap layer M1, the comparative example of FIG. 9, the examples of FIG. 10 and FIG. 11, and the comparative example of FIG. 12.

The reference shows each value in the organic light emitting diode display without the overlap layer M1. The storage capacitor Cst has a value of 57.28 F and the instant afterimage has a value of 7.6 seconds.

In the comparative example of FIG. 9, the base portion M1-1 of the overlap layer M1 overlaps the first electrode S1 or the second electrode D1 at opposite sides of the channel of the driving transistor T1. The distance between ends of the overlap layer M1 with respect to the gate electrode 155 is 1.25 μm. In this case, the capacitance of the storage capacitor Cst is 68.19 F, and the capacitances of the additional storage capacitors Cse and Cde are 9.51 F and 4.23 F, respectively. It is seen that the instant afterimage is 7.5 seconds and is ameliorated by 0.1 seconds compared with the reference which does not include the overlap layer M1.

TABLE 1

|  | First distance (d1, μm) | Second distance (d2, μm) | Cst (F) | Cde (F) | Cse (F) | Instant afterimage (seconds) |
| --- | --- | --- | --- | --- | --- | --- |
| Reference | Without overlap layer M1 | | 57.28 | — | — | 7.6 |
| FIG. 9 | 1.25 | 1.25 | 68.19 | 9.51 | 4.23 | 7.5 |
| FIG. 10 | 1.75 | 1.75 | 67.71 | 10.08 | 4.66 | 6.9 |
| FIG. 11 | 3.85 | 1.75 | 67.60 | 11.84 | 5.29 | 4.4 |
| FIG. 12 | — | | 67.51 | 11.47 | 7.94 | 7.6 |

In FIG. 10 and FIG. 11, only the overlap layer M1, the semiconductor layer 130, the scan line 151, and the gate electrode 155 are illustrated.

In the example of FIG. 10, the base portion M1-1 may have a first distance d1 and a second distance d2 within a range of 1.5 μm to 2.0 μm, e.g., 1.75 μm. Compared with FIG. 9, the distance from the gate electrode 155 of the base portion M1-1 to each of the first electrode S1 and the second electrode D1 was increased by 0.5 μm.

In this case, the left side of the base portion M1-1 is formed to overlap portions of the semiconductor layer 130 including the second transistor T2 and the first electrode S1 of the driving transistor T1. The base portion M1-1 does not overlap most of the semiconductor layer 130 including the second transistor T2 and the first electrode S1.

Referring to Table 1, the capacitance of the storage capacitor Cst is 67.71 F, and the capacitances of the additional storage capacitors Cse and Cde are 10.08 F and 4.66 F, respectively. The instant afterimage is 6.9 seconds, which is ameliorated by 0.6 seconds as compared with the comparative example of FIG. 9.

In the example of FIG. 11, in the overlap layer M1-1, the first distance d1 may be within a range of 2.0 to 4.0 μm, and the second interval d2 may be within a range of 1.5 to 2.0 μm. For example, the first distance d1 may be 3.85 μm, and the second distance d2 may be 1.75 μm. When compared to FIG. 10, the first distance d1 is further increased by 2.1 μm, and a distance to the second electrode D1 is the same. That is, the overlap layer M1 further includes the first extension M1-S that overlaps most or all of the first electrode S1 of the driving transistor T1.

The first extension M1-S extends from a left side of the base portion M1-1 toward the first electrode S1 of the driving transistor T1 to overlap the semiconductor layer 130 including the second transistor T2 and the first electrode S1. The left side of the first extension M1-S may be formed to coincide with widths of the semiconductor layer 130 including the second transistor T2 and the first electrode S1.

A design margin that is greater than a predetermined distance is required between the overlap layers M1 formed in adjacent pixels. A minimum distance between the overlap layers M1 formed in adjacent pixels is referred to as a third distance d3. According to the example of FIG. 11, the overlap layers M1 of the adjacent pixels are patterned such that the third distance d3 has a value of 2.5 μm. For example, the first extension M1-S may have and angled upper side, as illustrated in FIG. 11, or may be stepped relative to the base portion M1-1, as illustrated in FIGS. 3 and 7.

When the third distance d3 is less than 2 μm, a problem such as a short-circuit between wires may occur due to residues remaining in the patterning etching process, thereby requiring a design margin of greater than a predetermined distance.

Referring to Table 1, the capacitance of the storage capacitor Cst is 67.60 F, and the capacitances of the additional storage capacitors Cse and Cde are 11.84 F and 5.29 F, respectively. The instant afterimage is 4.4 seconds, which is ameliorated by 3.1 seconds as compared with the embodiment of FIG. 9. Compared to the above-mentioned examples, the reduction of the afterimage is more than 5 times, showing the excellent afterimage characteristic.

In the comparative example of FIG. 12, the first extension M1-S extends beyond an adjacent pixel area at the left side of the semiconductor layer 130. The base portion M1-1 and the second extension M1-3 of the adjacent pixel extend beyond the semiconductor layer 130 including the second electrode D1 of the driving transistor T1 to form a second extension M1-D. Accordingly, an overlap occurs between the overlap layers M1 formed in each of the adjacent pixels. That is, the first extension M1-S and the second extension M1-D overlap each other.

Referring to Table 1, the capacitance of the storage capacitor Cst is 67.51 F, and the capacitances of the additional storage capacitors Cse and Cde are 11.47 F and 7.94 F, respectively. The instant afterimage was 7.6 seconds, and the instant afterimage further increased by 0.1 seconds compared to that in the comparative example of FIG. 9.

In the example of FIG. 12, as an area of the overlap layer M1 has a maximum value as compared with the aforementioned exemplary embodiments, the capacitance of the additional storage capacitors Cde and Cse has a large value. However, since the overlap layers M1 of the adjacent pixels exceed a design margin, the effect of ameliorating the afterimage worsens due to a short-circuit etc. caused by the residue even when the capacitance of the additional storage capacitors Cde and Cse increases.

Figure 13:
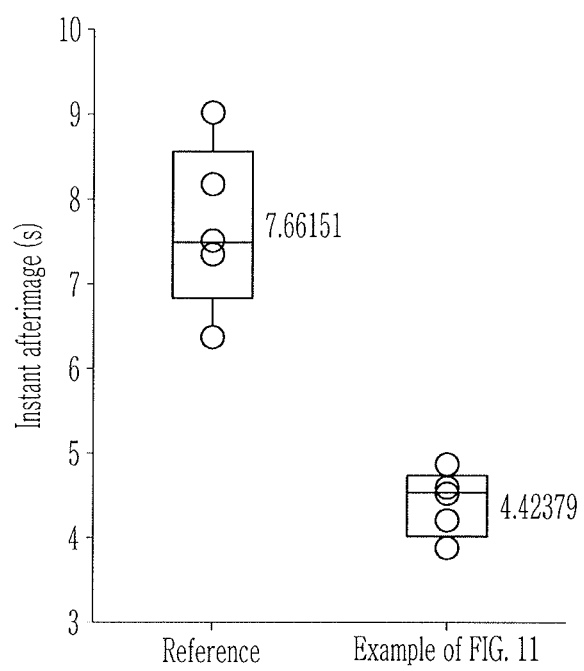
FIG. 13 illustrates a graph showing afterimage characteristics for a comparative example and an example.

Hereinafter, an afterimage characteristic according to an example and a comparative example will be described with reference to FIG. 13. FIG. 13 illustrates a graph showing an instant afterimage for a comparative example and an example.

In FIG. 13, a y-axis indicates a time axis in a unit of seconds, and a time when a contrast ratio (CR) remains larger than the reference is measured based on the afterimage of a certain degree. Specifically, it indicates that as more time passes, the display has a different luminance than the desired luminance for a long time, and the time is proportional to the time the gray is visible when black and white are displayed.

A time of measuring the instant afterimage will be described with reference to FIG. 13. According to the Reference, a gray is displayed for about 7.66 seconds, while according to the exemplary embodiment of FIG. 11, the gray is displayed for about 4.42 seconds.

Although not shown in the graph of FIG. 13, referring to Table 1, the overlap layer M1 is formed to allow the first distance d1 and the second distance to have constant values, and the instant afterimage is decreased by 0.1 seconds and 0.7 seconds in the examples of FIG. 9 and FIG. 10, respectively, compared with the Reference.

In the example of FIG. 11, as the first distance d1 of the overlap layer M1 is increased to 3.85 μm, the instant afterimage is 4.4 seconds, which is reduced by 3.2 seconds compared to the Reference. That is, it is seen that since a reduction range of the instant afterimage is about 5 times greater than those in the comparative example of FIG. 9 and the example of FIG. 10, a reduction effect of instant afterimages is excellent according to the example of FIG. 11. When the overlap layer overlaps the first electrode of the driving transistor, an instant afterimage is reduced by 3 seconds or more compared to when the overlap layer does not overlap the first electrode of the driving transistor.

By way of summation and review, embodiments provide an organic light emitting display in which an instant afterimage is ameliorated by optimizing an area of an overlap layer between a semiconductor layer and a substrate that increase capacitance.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic light emitting diode display, comprising:
   a substrate;
   a semiconductor layer on the substrate;
   a first gate conductor disposed on and overlapping the semiconductor layer;
   a data conductor disposed on the first gate conductor and disposed in a layer above a layer of the first gate conductor;
   an overlap layer disposed between the substrate and the semiconductor layer;
   a driving transistor on the overlap layer, the driving transistor includes a first electrode formed by doping a first region of the semiconductor layer, a second electrode formed by doping a second region of the semiconductor layer, a channel formed between the first electrode and the second electrode, and a first gate electrode formed of the first gate conductor to overlap the channel; and
   an organic light emitting diode connected with the driving transistor, wherein
   the overlap layer includes a base portion that overlaps the channel of the driving transistor and receives a constant voltage,
   the overlap layer includes a first extension portion electrically connected to the base portion and that constitutes part of an additional storage capacitor, and
   the overlap layer overlaps the first electrode of the driving transistor.

2. The organic light emitting diode display as claimed in claim 1, further comprising:
   a storage line on and overlapping the first gate electrode;

a driving voltage line formed of a portion of the data conductor; and a gate insulating layer between the first gate electrode and the storage line, wherein a driving voltage is applied to the storage line through the driving voltage line, and the first gate electrode and the storage line constitute a storage capacitor that maintains a voltage across the first gate electrode.

3. The organic light emitting diode display of claim 1, wherein a buffer layer is disposed between the overlap layer and the semiconductor layer the base portion overlaps the channel of the driving transistor, and the base portion and the channel of the driving transistor constitute a first additional storage capacitor.

4. The organic light emitting diode display of claim 1, wherein a buffer layer is disposed between the overlap layer and the semiconductor layer the overlap layer includes a first extension that overlaps the first electrode of the driving transistor, and the first extension and the first electrode of the semiconductor layer constitute a second additional storage capacitor.

5. The organic light emitting diode display of claim 1, wherein the overlap layer extends so that a side of the overlap layer adjacent to the first electrode of the driving transistor coincides with a side of the first electrode of the driving transistor in a plan view.

6. The organic light emitting diode display of claim 1, wherein a first distance between a side of the first gate electrode adjacent to the first electrode of the driving transistor and a side of the overlap layer adjacent to the first electrode of the driving transistor is in a range of 1.0 μm to 4.0 μm.

7. The organic light emitting diode display of claim 1, wherein a distance between the overlap layer and an overlap layer of another pixel that is disposed adjacent to the overlap layer is in a range of 2.0 μm to 2.5 μm.

8. The organic light emitting diode display of claim 2, further comprising a second transistor and a third transistor, wherein the second transistor is connected to a scan line and a data line to transmit a data voltage transmitted through the data line to the first electrode of the driving transistor, the third transistor is connected to the first gate electrode and the second electrode of the driving transistor to transfer the data voltage to the storage capacitor, and the overlap layer further includes a second extension that overlaps the semiconductor layer of the third transistor.

9. The organic light emitting diode display as claimed in claim 8, wherein the second extension of the overlap layer and the semiconductor layer of the third transistor constitute a third additional storage capacitor.

10. The organic light emitting diode display as claimed in claim 2, wherein the overlap layer overlaps at least a portion of the second electrode of the driving transistor, and the overlap layer and the second electrode of the driving transistor constitute a fourth additional storage capacitor.

11. The organic light emitting diode display as claimed in claim 1, wherein the driving transistor includes a second gate electrode formed of a second gate conductor disposed between the first gate conductor and the data conductor.

12. The organic light emitting diode display as claimed in claim 1, wherein the overlap layer does not overlap an entirety of the semiconductor layer.

13. The organic light emitting diode display as claimed in claim 1, wherein at least a portion of the data conductor is directly on the first gate electrode.

14. The organic light emitting diode display as claimed in claim 1, wherein at least a portion of the data conductor overlaps the first gate electrode.

* * * * *